US012672318B2

(12) United States Patent
Choi et al.

(10) Patent No.: US 12,672,318 B2
(45) Date of Patent: Jun. 30, 2026

(54) SEMICONDUCTOR DEVICES INCLUDING BUFFER LAYER STRUCTURE

(71) Applicant: Samsung Electronics Co., Ltd., Suwon-si (KR)

(72) Inventors: Won Hee Choi, Seoul (KR); Sung Uk Jang, Hwaseong-si (KR); Dong Suk Shin, Suwon-si (KR); Bong Jin Kuh, Suwon-si (KR); Kong Soo Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 641 days.

(21) Appl. No.: 17/829,781

(22) Filed: Jun. 1, 2022

(65) Prior Publication Data

US 2023/0116342 A1      Apr. 13, 2023

(30) Foreign Application Priority Data

Oct. 7, 2021     (KR) ........................ 10-2021-0132798

(51) Int. Cl.
*H10D 30/69*          (2025.01)
*H10B 12/00*          (2023.01)
            (Continued)

(52) U.S. Cl.
CPC ........... *H10D 30/797* (2025.01); *H10B 12/30* (2023.02); *H10D 30/6734* (2025.01);
            (Continued)

(58) Field of Classification Search
CPC ............. H10D 30/797; H10D 30/6734; H10D 30/6735; H10D 30/6757; H10D 62/121;
            (Continued)

(56) References Cited

U.S. PATENT DOCUMENTS 9,099,424 B1      8/2015  Sekar et al.
9,136,153 B2      9/2015  Or-Bach et al.
            (Continued)

FOREIGN PATENT DOCUMENTS

KR      10-2016-0091173 A      8/2016

OTHER PUBLICATIONS

"First Office Action", TW Application No. 111137308, Jun. 9, 2023, 4 pp.

*Primary Examiner* — Duy T Nguyen
(74) *Attorney, Agent, or Firm* — Wolf, Greenfield & Sacks, P.C.

(57)          ABSTRACT

A semiconductor device is provided. A semiconductor device includes: a first active pattern spaced apart from a substrate and extending in a first direction; a second active pattern spaced apart further from the substrate than the first active pattern and extending in the first direction; a gate structure on the substrate, the gate structure extending in a second direction crossing the first direction and penetrating the first active pattern and the second active pattern; a first source/drain region on at least one side surface of the gate structure and connected to the first active pattern; a second source/drain region on at least one side surface of the gate structure and connected to the second active pattern; and a buffer layer between the substrate and the first active pattern, the buffer layer containing germanium.

20 Claims, 27 Drawing Sheets

(51) Int. Cl.
    H10D 30/67          (2025.01)
    H10D 62/10          (2025.01)

(52) U.S. Cl.
    CPC ..... H10D 30/6735 (2025.01); H10D 30/6757 (2025.01); H10D 62/121 (2025.01); *H10B 12/36* (2023.02)

(58) Field of Classification Search
    CPC .... H10D 30/43; H10D 64/017; H10D 30/014; H10D 62/822; H10D 84/0167; H10D 84/017; H10D 84/0188; H10D 84/038; H10D 84/85; H10D 88/00; H10D 88/01; H10D 84/0172; H10D 84/0181; H10B 12/30; H10B 12/36; H10B 12/03; H10B 12/05; H10B 12/488; B82Y 10/00
    USPC ......................................................... 257/296
    See application file for complete search history.

(56) References Cited

U.S. PATENT DOCUMENTS

| | | | |
|---|---|---|---|
| 9,450,046 B2 | 9/2016 | Wen et al. | |
| 9,716,145 B2 | 7/2017 | Balakrishnan et al. | |
| 10,522,625 B2 | 12/2019 | Chen et al. | |
| 10,727,323 B2 | 7/2020 | Li et al. | |
| 10,833,069 B2 | 11/2020 | Zhang et al. | |
| 10,861,852 B2 | 12/2020 | Li et al. | |
| 10,896,851 B2 | 1/2021 | Cheng et al. | |
| 2014/0054538 A1* | 2/2014 | Park | H10N 70/881 257/5 |
| 2014/0252469 A1* | 9/2014 | Lee | H10D 30/798 438/283 |
| 2014/0353715 A1* | 12/2014 | Xiao | H10D 84/038 257/190 |
| 2015/0364578 A1* | 12/2015 | Liu | H10D 30/62 438/283 |
| 2016/0218181 A1* | 7/2016 | Yang | H01L 21/02532 |
| 2019/0131394 A1* | 5/2019 | Reznicek | H10D 30/6739 |
| 2019/0196830 A1 | 6/2019 | Lilak et al. | |
| 2019/0214459 A1* | 7/2019 | Cheng | H10D 30/024 |
| 2019/0326290 A1* | 10/2019 | Cea | H10D 62/121 |
| 2020/0111781 A1 | 4/2020 | Kim et al. | |
| 2020/0135862 A1 | 4/2020 | Chen et al. | |
| 2020/0395457 A1 | 12/2020 | Zhou | |
| 2020/0403095 A1 | 12/2020 | Chen et al. | |

* cited by examiner

SEMICONDUCTOR DEVICES INCLUDING BUFFER LAYER STRUCTURE

CROSS-REFERENCE TO RELATED APPLICATION

This application claims priority from Korean Patent Application No. 10-2021-0132798 filed on Oct. 7, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor devices.

2. Description of the Related Art

In the case of conventional two-dimensional or planar semiconductor devices, since their integration density is mainly determined by the area occupied by a unit memory cell, it is greatly influenced by the level of fine pattern forming technology. However, since extremely high-priced equipment is required for the miniaturization of patterns, the integration density of the two-dimensional semiconductor devices has been increased but is still limited. Accordingly, three-dimensional semiconductor memory devices having memory cells arranged three-dimensionally have been proposed.

Meanwhile, as one of scaling techniques for increasing the density of integrated circuit devices, a multi-gate transistor has been proposed, in which a fin- or nanowire-shaped silicon body is formed on a substrate and a gate is formed on the surface of the silicon body.

Since the multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

SUMMARY

Aspects of the present disclosure provide a semiconductor device with improved reliability.

According to an embodiment of the present disclosure, there is a semiconductor device comprising: a first active pattern spaced apart from a substrate and extending in a first direction; a second active pattern spaced apart further from the substrate than the first active pattern and extending in the first direction; a gate structure on the substrate; the gate structure extending in a second direction crossing the first direction and penetrating the first active pattern and the second active pattern; a first source/drain region on a side surface of the gate structure and connected to the first active pattern; a second source/drain region on a side surface of the gate structure and connected to the second active pattern; and a buffer layer between the substrate and the first active pattern, and the buffer layer comprising germanium.

According to the aforementioned and other embodiments of the present disclosure, there is provided a semiconductor device comprising: a first sheet pattern and a second sheet pattern spaced apart from each other on a substrate, each of the first and second sheet patterns extending in a first direction; a third sheet pattern and a fourth sheet pattern spaced apart from each other and on the second sheet pattern, each of the third and fourth sheet patterns extending in the first direction; a gate structure on the substrate, the gate structure extending in a second direction crossing the first direction and penetrating the first to fourth sheet patterns to be alternately disposed with the first to fourth sheet patterns; a first source/drain region on a side surface of the gate structure and connected to the first sheet pattern and the second sheet pattern; a second source/drain region on a side surface of the gate structure and connected to the third sheet pattern and the fourth sheet pattern; and a buffer layer between the substrate and the first sheet pattern, the buffer layer comprising germanium, wherein a thickness of the buffer layer is greater than a thickness of each of the first to fourth sheet patterns.

According to the aforementioned and other embodiments of the present disclosure, there is provided a semiconductor device comprising: a bit line on a substrate; the bit line extending in a first direction perpendicular to a top surface of the substrate; a plurality of semiconductor patterns connected to the bit line and extending in a second direction parallel to the top surface of the substrate; a plurality of gate patterns extending in a third direction different from the first and second directions the plurality of gate patterns being alternately disposed with the plurality of semiconductor patterns on the plurality of semiconductor patterns; an information storage element connected to the plurality of semiconductor patterns; and a buffer layer between the substrate and the plurality of semiconductor patterns, the buffer layer comprising germanium.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, a semiconductor device according to exemplary embodiments will be described with reference to FIGS. 1 to 10. Although the terms first, second, etc. may be used herein to describe various elements or components, these elements or components should not be limited by these terms. These terms are used to distinguish one element or component from another element or component. Thus, a first element or component discussed below could be termed a second element or component without departing from the teachings of the present disclosure.

Figure 1:
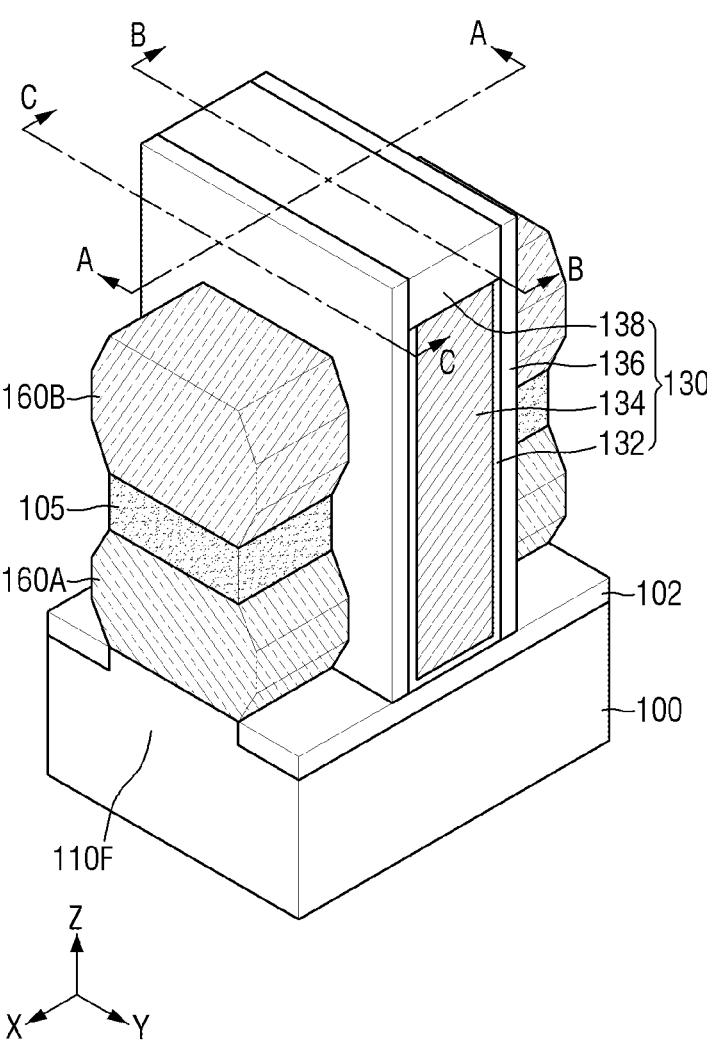
FIG. 1 is a perspective view illustrating a semiconductor device according to example embodiments.
Figure 2:
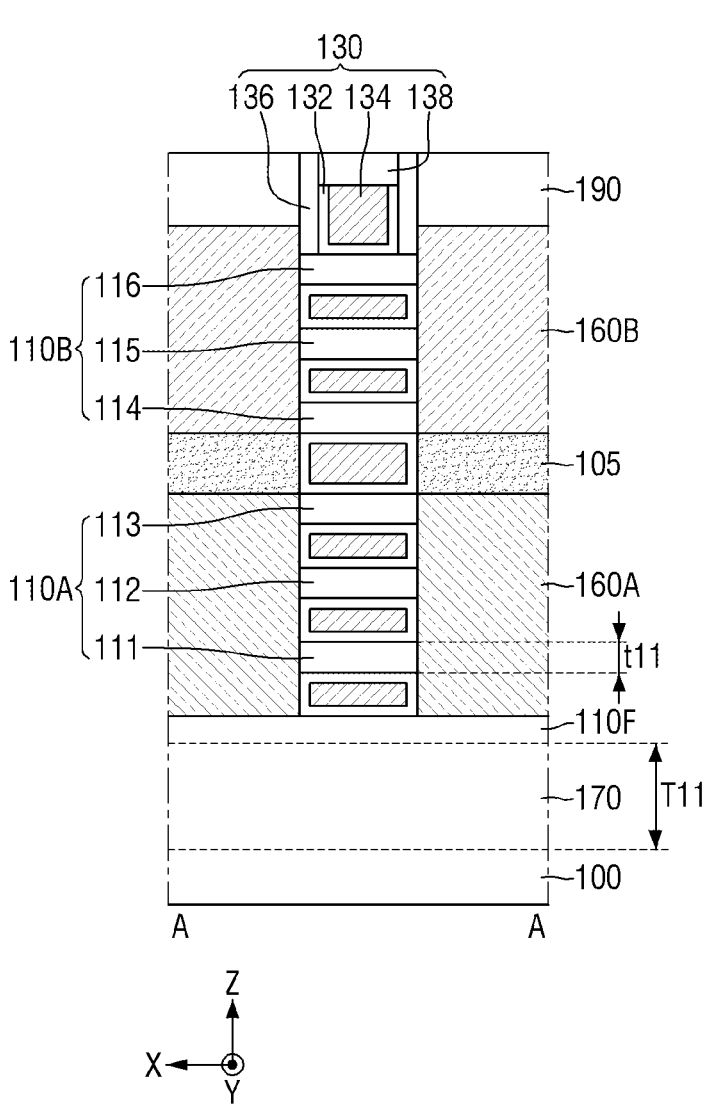
FIG. 2 is a cross-sectional view taken along line A-A of FIG. 1.
Figure 3:
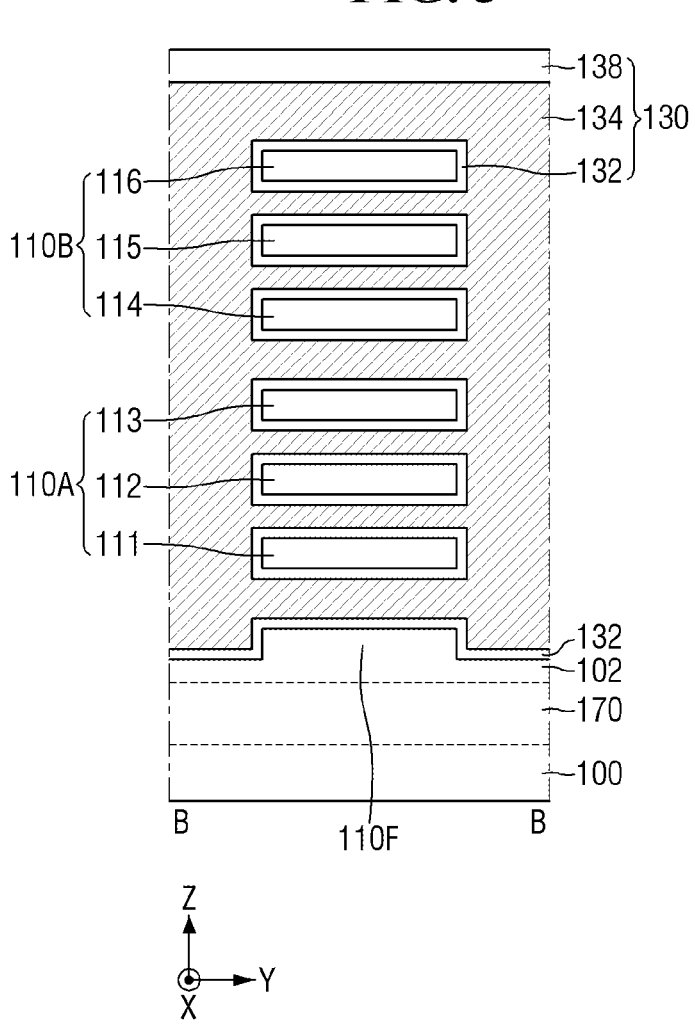
FIG. 3 is a cross-sectional view taken along line B-B of FIG. 1.
Figure 4:
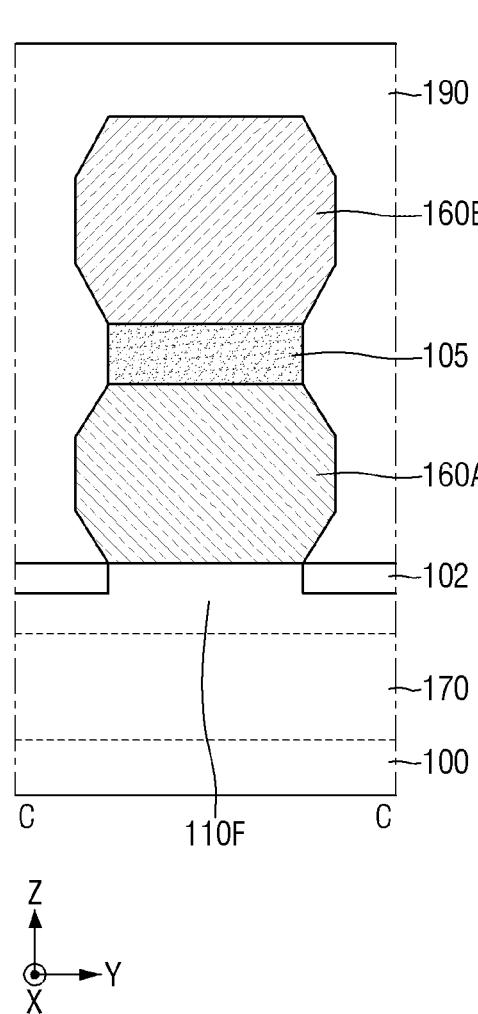
FIG. 4 is a cross-sectional view taken along line C-C of FIG. 1.

FIG. 1 is a perspective view illustrating a semiconductor device according to example embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1.

Referring to FIGS. 1 to 4, a semiconductor device according to example embodiments includes a substrate 100, a first active pattern 110A, a second active pattern 110B, a gate structure 130, a first source/drain region 160A, a second source/drain region 160B, a buffer layer 170, an insulating structure 105, and an interlayer insulating layer 190. For simplicity of description, the interlayer insulating layer 190 is not illustrated in FIG. 1.

The substrate 100 may be a bulk silicon or silicon-on-insulator (SOI) substrate. Alternatively, the substrate 100 may be a silicon substrate or may include other materials such as silicon germanium, silicon germanium on insulator (SGOI), indium antimonide, a lead tellurium compound, indium arsenide, indium phosphide, gallium arsenide, or gallium antimonide. Alternatively, the substrate 100 may have an epitaxial layer formed on a base substrate. For simplicity of description, hereinafter, it is assumed that the substrate 100 is a silicon substrate.

The first active pattern 110A and the second active pattern 110B may be above the substrate 100. In one embodiment, the first active pattern 110A may be spaced apart from the substrate 100 above the substrate 100. The second active pattern 110B may be spaced apart from the first active pattern 110A above the first active pattern 110A. As used herein, when the term Element A is "above" Element B is used, it may refer to the situation where Element A is further away from a reference plane (such as the top surface of the substrate) in a particular direction than Element B. For example, in FIG. 2, the second active pattern 110B is said to be above the first active pattern 110A because the second active pattern 110B is further away from the top surface of the substrate 100 in the vertical, or Z, direction than the first active pattern 110A is. That is, the second active pattern 110B may be spaced apart further from the substrate 100 than the first active pattern 110A. Each of the first active pattern 110A and the second active pattern 110B may extend in a first direction X parallel to the top surface of the substrate 100. The first active pattern 110A and the second active pattern 110B may overlap in a direction (e.g., a third direction Z) crossing the top surface of the substrate 100. As used herein, when element A is said to "overlap" or is "overlapping" element B, it may refer to the situation where element A is said to extend over or past, and cover a part of, element B in a given direction (such as in Z direction in this case). Note that element A may overlap element B in a given direction, but may or may not overlap element B in a different direction.

Each of the first active pattern 110A and the second active pattern 110B may include silicon (Si) or germanium (Ge), which is an elemental semiconductor material. Alternatively, each of the first active pattern 110A and the second active pattern 110B may include a compound semiconductor, for example, a group Iv-Iv compound semiconductor or a group III-V compound semiconductor. The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element. The group III-V compound semiconductor may be, for example, a binary compound, a ternary compound or a quaternary compound formed by combining at least one of aluminum (Al), gallium (Ga) and indium (In) which are group III elements with at least one of phosphorus (P), arsenic (As) and antimuonium (Sb) which are group V elements. For simplicity of description, the following description is directed to the case where each of the first active pattern 110A and the second active pattern 110B is a silicon pattern.

In some embodiments, the first active pattern 110A may include a plurality of lower sheet patterns (e.g., first to third sheet patterns 111, 112, 113) that are sequentially disposed above the substrate 100 while being spaced apart from each other. The first to third sheet patterns 111, 112, 113 may be spaced apart from the substrate 100.

In some embodiments, the second active pattern 110B may include a plurality of upper sheet patterns (e.g., fourth to sixth sheet patterns 114, 115, 116) that are sequentially disposed above the first active pattern 110A while being spaced apart from each other. The fourth to sixth sheet patterns 114, 115, 116 may be spaced apart further from the substrate 100 than the first to third sheet patterns 111, 112, 113.

In some embodiments, a fin pattern 110F may be formed between the substrate 100 and the first active pattern 110A. The fin pattern 110F may protrude from the top surface of the substrate 100 and extend in the first direction X. The fin pattern 110F may be formed by partially etching the substrate 100, or may be an epitaxial layer grown from the substrate 100.

In some embodiments, a field insulating layer 102 may be formed on, and at least partially cover, the substrate 100. The field insulating layer 102 may be on, and cover at least a part of, the side surface of the fin pattern 110F. Although it is illustrated that the top surface of the field insulating layer 102 is coplanar with the top surface of the fin pattern 110F, this is only exemplary. As another example, the upper portion of the fin pattern 110F may protrude from the top surface of the field insulating layer 102. The field insulating layer 102 may include, for example, at least one of silicon oxide, silicon nitride, silicon oxynitride, or a combination thereof, but is not limited thereto. In some other embodiments, the field insulating layer 102 may be omitted.

The gate structure 130 may be formed on the substrate 100 and the field insulating layer 102. The gate structure 130 may intersect the first active pattern 110A and the second active pattern 110B. For example, the gate structure 130 may extend in a second direction Y parallel to the top surface of the substrate 100 and crossing the first direction X. Each of the first active pattern 110A and the second active pattern 110B may extend in the first direction X to pass through at least a portion of the gate structure 130. That is, the gate structure 130 may surround the side surface of the first active pattern 110A and the side surface of the second active pattern 110B. It will be understood that "an element A surrounds an element B" (or similar language) as used herein means that the element A is at least partially around the element B but does not necessarily mean that the element A completely encloses the element B.

In some embodiments, the gate structure 130 may include a gate dielectric layer 132, a gate electrode 134, a gate spacer 136, and a gate capping pattern 138.

The gate electrode 134 may be formed above the substrate 100 and the field insulating layer 102. The gate electrode 134 may extend in the second direction Y to intersect the first active pattern 110A and the second active pattern 110B.

The gate electrode 134 may include, for example, at least one of TiN, WN, TaN, Ru, TiC, TaC, Ti, Ag, Al, TiAl, TiAlN, TiAlC, TaCN, TaSiN, Mn, Zr, W, Al or a combination thereof, but is not limited thereto. The gate electrode 134 may be formed, for example, by a replacement process, but is not limited thereto. Although the gate electrode 134 is illustrated as being a single layer, this is only exemplary, and the gate electrode 134 may be formed by stacking a plurality of conductive layers. For example, the gate electrode 134 may include a work function adjusting layer to adjust the work function and a filling conductive layer to fill a space formed by the work function adjusting layer. The work function adjusting layer may include at least one of TiN, TaN, TiC, TaC, TiAlC or a combination thereof, for example. The filling conductive layer may include, for example, W or Al.

The gate dielectric layer 132 may be between the first active pattern 110A and the gate electrode 134, and between the second active pattern 110B and the gate electrode 134. Further, the gate dielectric layer 132 may also be between the fin pattern 110F and the gate electrode 134, and between the field insulating layer 102 and the gate electrode 134.

The gate dielectric layer 132 may include, for example, at least one of silicon oxide, silicon oxynitride, silicon nitride, or a high-k material having a higher dielectric constant than silicon oxide. The high-k material may include, for example, at least one selected from the group consisting of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and a combination thereof, but is not limited thereto.

Although not specifically illustrated, an interfacial layer may be formed between the first active pattern 110A and the gate dielectric layer 132, and between the second active pattern 110B and the gate dielectric layer 132. The interfacial layer may include, for example, a silicon oxide layer, but is not limited thereto.

The gate spacer 136 may be formed on the substrate 100 and the field insulating layer 102. The gate spacer 136 may extend along the side surface of the gate electrode 134. In some embodiments, the gate dielectric layer 132 may be between the gate electrode 134 and the gate spacer 136. For example, the gate dielectric layer 132 may further extend along an inner side surface of the gate spacer 136. The gate dielectric layer 132 may be formed through a replacement step, but is not limited thereto.

The gate spacer 136 may include, for example, at least one of silicon nitride, silicon oxynitride, silicon oxycarbide, silicon boron nitride, silicon boron carbonitride, silicon oxycarbonitride, or a combination thereof, but is not limited thereto.

The gate capping pattern 138 may cover at least a part of the top surface of the gate electrode 134. For example, the gate capping pattern 138 may extend along the top surface of the gate electrode 134. Although it is illustrated that the top surface of the gate spacer 136 is coplanar with the top surface of the gate capping pattern 138, this is only exemplary. As another example, the gate capping pattern 138 may be formed to cover the top surface of the gate spacer 136.

The gate capping pattern 138 may include, for example, at least one of silicon nitride, silicon oxynitride, silicon oxycarbide, silicon boron nitride, silicon boron carbonitride, silicon oxycarbonitride, or a combination thereof, but is not limited thereto.

The first source/drain region 160A may be formed on the top surface of the substrate 100 and at least one side surface (both side surfaces in some embodiments) of the gate structure 130. The first source/drain region 160A may be connected to the first active pattern 110A. For example, each of the first to third sheet patterns 111, 112, 113 may pass through the gate structure 130 to be connected to the first source/drain region 160A. The first source/drain region 160A may be electrically isolated from the gate electrode 134 by the gate dielectric layer 132 and/or the gate spacer 136.

The second source/drain region 160B may be formed above the top surface of the first source/drain region 160A and on at least one side surface (both side surfaces in some embodiments) of the gate structure 130. The second source/drain region 160B may be connected to the second active pattern 110B. For example, each of the fourth to sixth sheet patterns 114, 115, 116 may pass through the gate structure 130 to be connected to the second source/drain region 160B. The second source/drain region 160B may be electrically isolated from the gate electrode 134 by the gate dielectric layer 132 and/or the gate spacer 136.

Each of the first source/drain region 160A and the second source/drain region 160B may include an epitaxial layer. For example, each of the first source/drain region 160A and the second source/drain region 160B may be formed by an epitaxial growth method. FIGS. 1 and 4 illustrate that each of the first source/drain region 160A and the second source/drain region 160B has an octagonal shape in cross-sectional view, but this is only exemplary. As another example, the first source/drain region 160A or the second source/drain region 160B may have various shapes such as a hexagonal shape, a diamond shape, and the like in cross-sectional view.

In some embodiments, the first source/drain region 160A and the second source/drain region 160B may have different conductivity types. For example, the first source/drain region 160A may have a first conductivity type, and the second source/drain region 160B may have a second conductivity type that is different from the first conductivity type. For example, the first conductivity type may be a p-type and the second conductivity type may be an n-type. In this case, the first active pattern 110A may be used as a channel region of a p-type field-effect transistor (PFET), and the second active pattern 110B may be used as a channel region of an n-type field-effect transistor (NFET). However, this is only exemplary, and the first conductivity type may be an n-type and the second conductivity type may be a p-type.

When the element formed by the first active pattern 110A or the second active pattern 110B is a p-type (e.g., PFET), the first source/drain region 160A or the second source/drain region 160B may include a p-type impurity or an impurity for preventing diffusion of a p-type impurity. For example, the first source/drain region 160A or the second source/drain region 160B may include at least one of B, C, In, Ga, Al, or a combination thereof.

In some embodiments, when the element formed by the first active pattern 110A or the second active pattern 110B is a p-type (e.g., PFET), the first source/drain region 160A or the second source/drain region 160B may include a compressive stress material. For example, when the first active pattern 110A or the second active pattern 110B is a silicon pattern, the first source/drain region 160A or the second source/drain region 160B may include a material having a high lattice constant (e.g., silicon germanium (SiGe)) compared to silicon (Si). The compressive stress material may enhance carrier mobility in the channel region by applying compressive stress to the first active pattern 110A or the second active pattern 110B.

When the element formed by the first active pattern 110A or the second active pattern 110B is an n-type (e.g., NFET), the first source/drain region 160A or the second source/drain region 160B may include an n-type impurity or an impurity for preventing diffusion of an n-type impurity. For example, the first source/drain region 160A or the second source/drain region 160B may include at least one of P, Sb, As, or a combination thereof.

In some embodiments, when the element formed by the first active pattern 110A or the second active pattern 110B is an n-type (e.g., NFET), the first source/drain region 160A or the second source/drain region 160B may include a tensile stress material. For example, when the first active pattern 110A or the second active pattern 110B is a silicon pattern, the first source/drain region 160A or the second source/drain region 160B may include a material having a low lattice constant (e.g., silicon carbide (SiC)) compared to silicon (Si). The tensile stress material may enhance the carrier mobility in the channel region by applying tensile stress to the first active pattern 110A or the second active pattern 110B.

The buffer layer 170 may be between the substrate 100 and the first active pattern 110A.

A thickness T11 of the buffer layer 170 may be greater than a thickness t11 of each of the lower sheet patterns (e.g., first to third sheet patterns 111, 112, 113) or the upper sheet patterns (e.g., fourth to sixth sheet patterns 114, 115, 116) spaced apart from each other. For example, the thickness T11 of the buffer layer 170 may be greater than 0.05 microns (μm) and less than 15 μm.

The buffer layer 170 may contain germanium (Ge). In some embodiments, the germanium concentration of the buffer layer 170 may be less than 30 atomic percent (at %). The buffer layer 170 may have a higher germanium concentration at a region closer to the first active pattern 110A in some embodiments. That is, the germanium concentration of the buffer layer 170 increases as it gets closer to the first active pattern 110A. The germanium concentration of the buffer layer 170 may be lower than the germanium concentration of sacrificial patterns 205A, 205B, and 210 which will be described later.

In the conventional semiconductor device formed by stacking a silicon germanium layer having a relatively large crystal lattice on a silicon substrate, the substrate may be constantly subjected to tensile stress. In this case, the accumulated tensile stress may deteriorate the product reliability of the semiconductor device having a stacked structure of silicon and silicon germanium layers.

According to some embodiments, the buffer layer 170 containing germanium may be on the substrate 100, and a stacked structure may be formed on the buffer layer 170, thereby preventing defects that may occur in the semiconductor device. In addition, a larger number of silicon/silicon-germanium stack structures may be formed, which may be more advantageous for scaling a semiconductor device.

The insulating structure 105 may be formed on at least one side surface (both side surfaces in some embodiments) of the gate structure 130. The insulating structure 105 may be between the first source/drain region 160A and the second source/drain region 160B. The insulating structure 105 may electrically separate the first source/drain region 160A from the second source/drain region 160B.

The insulating structure 105 may not be between the first active pattern 110A and the second active pattern 110B. For example, the insulating structure 105 may not be between the first active pattern 110A (e.g., the third sheet pattern 113) and the gate structure 130, and between the gate structure 130 and the second active pattern 110B (e.g., the fourth sheet pattern 114). That is, the two insulating structures 105, which are respectively disposed on both side surfaces of the gate structure 130, may be separated from each other by the gate structure 130. In some embodiments, the bottom surface of the insulating structure 105 may be coplanar with the top surface of the first active pattern 110A.

The insulating structure 105 may include, for example, at least one of silicon nitride, silicon oxynitride, silicon oxycarbide, silicon boron nitride, silicon boron carbonitride, silicon oxycarbonitride, or a combination thereof, but is not limited thereto.

The interlayer insulating layer 190 may be formed on the substrate 100 and the field insulating layer 102. The interlayer insulating layer 190 may be formed to fill a space on the outer surface of the gate spacer 136. For example, the interlayer insulating layer 190 may cover at least a portion of the first source/drain region 160A, at least a portion of the second source/drain region 160B, and at least a portion of the insulating structure 105. Although it is illustrated that the interlayer insulating layer 190 exposes the top surface of the gate structure 130, this is only exemplary. The interlayer insulating layer 190 may cover all or part of the top surface of the gate structure 130.

The interlayer insulating layer 190 may include, for example, at least one of silicon oxide, silicon nitride, silicon oxynitride, silicon oxycarbide, silicon boron nitride, silicon boron carbonitride, silicon oxycarbonitride, or a low-k material (a material having the same or lower dielectric constant as that of silicon oxide). The low-k material may include, for example, at least one of flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof, but is not limited thereto.

9

Figure 5:
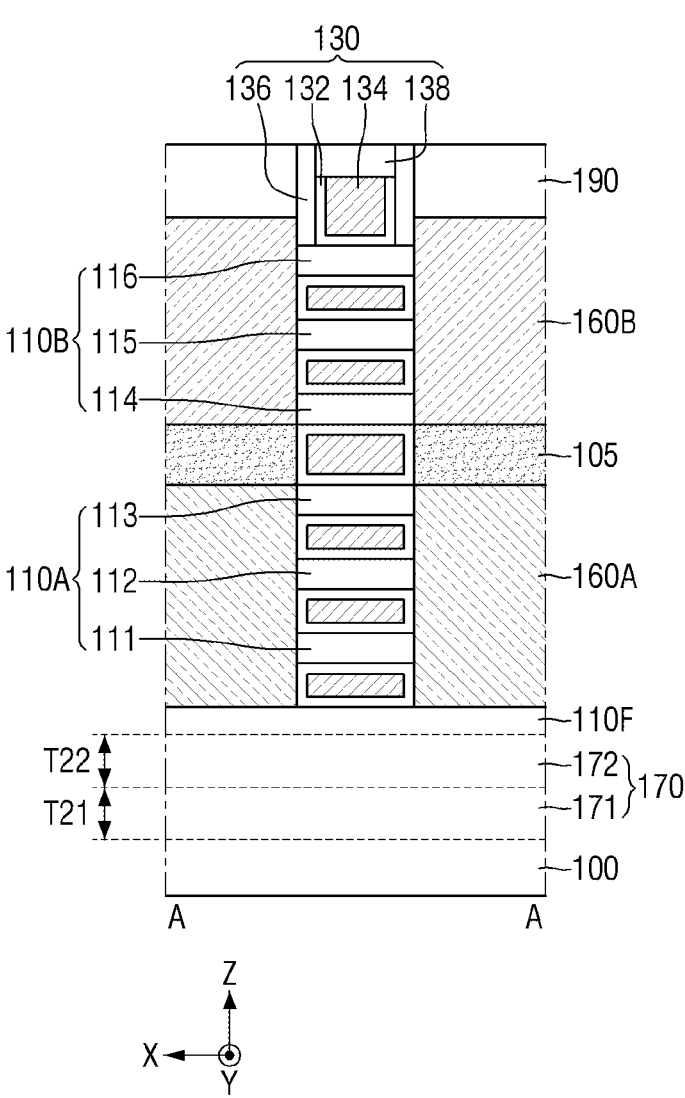
FIG. 5 is a cross-sectional view illustrating a semiconductor device according to example embodiments.

FIG. 5 is a cross-sectional view illustrating a semiconductor device according to example embodiments. For simplicity of description, redundant parts of the description made with reference to FIGS. 1 to 4 may be recapitulated or omitted.

Referring to FIG. 5, the buffer layer 170 may include first and second buffer layers 171 and 172 sequentially stacked on the substrate 100, the first and second buffer layers containing germanium at first and second concentrations, respectively. In this some embodiments, the second concentration of the second buffer layer 172 may be higher than the first concentration of the first buffer layer 171. In some embodiments, the first and second buffer layers 171 and 172 may respectively have thicknesses T21 and T22 greater than 0.05 μm and less than 15 μm. In some embodiments, the thicknesses T21 and T22 may be the same, but in other embodiments, the thicknesses T21 and T22 may be different.

Figure 6:
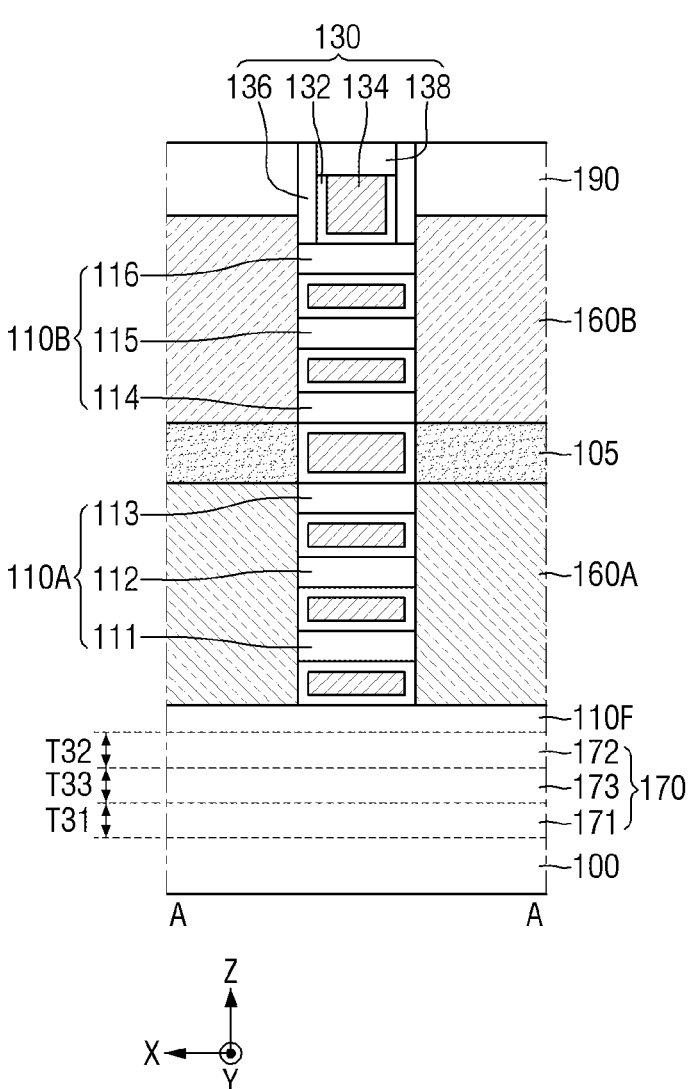
FIG. 6 is a cross-sectional view illustrating a semiconductor device according to example embodiments.

FIG. 6 is a cross-sectional view illustrating a semiconductor device according to example embodiments. For simplicity of description, redundant parts of the description made with reference to FIGS. 1 to 4 may be recapitulated or omitted.

Referring to FIG. 6, the buffer layer 170 may further include a third buffer layer 173 between the first and second buffer layers 171 and 172, the third buffer layer 173 containing germanium at a third concentration. In some embodiments, the third concentration of the third buffer layer 173 may be higher than the first concentration of the first buffer layer 171 and lower than the second concentration of the second buffer layer 172. In some embodiments, the first to third buffer layers 171, 172, and 173 may respectively have thicknesses T31, T32, and T33 greater than 0.05 μm and less than 15 μm. In some embodiments, the thicknesses T21, T22, and T23 may be the same, but in other embodiments, the thicknesses T21, T22, and T23 may be different.

Figure 7:
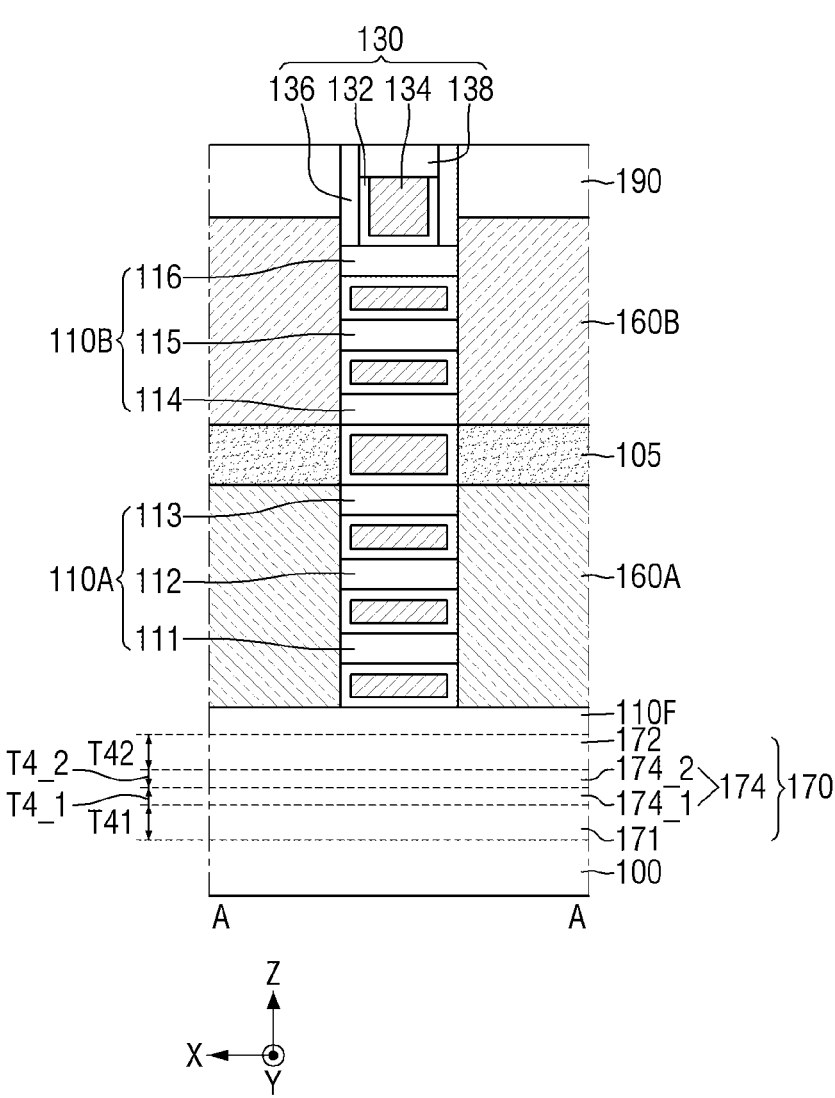
FIG. 7 is a cross-sectional view illustrating a semiconductor device according to example embodiments.

FIG. 7 is a cross-sectional view illustrating a semiconductor device according to example embodiments. For simplicity of description, redundant parts of the description made with reference to FIGS. 1 to 4 may be recapitulated or omitted.

Referring to FIG. 7, the buffer layer 170 may include a unit structure 174 in which a first layer 174_1 containing germanium and a second layer 174_2 containing germanium at a higher concentration than that of the first layer 174_1 are stacked. The unit structure 174 may be between the first and second buffer layers 171 and 172.

Although FIG. 7 shows a single unit structure 174, in some embodiments, a plurality of the unit structures 174, each of which includes the first layer 174_1 and the second layer 174_2, may be between the first and second buffer layers 171 and 172. In this case, the plurality of unit structures 174, each of which includes the first layer 174_1 and the second layer 174_2 containing germanium at different concentrations, may be formed by being repeatedly stacked between the first and second buffer layers 171 and 172.

The first and second buffer layers 171 and 172 may respectively have thicknesses T41 and T42 greater than thicknesses T4_1 and T4_2 of the first layer 174_1 and the second layer 174_2 of the unit structure 174. For example, each of the thicknesses T4_1 and T4_2 of the first layer 174_1 and the second layer 174_2 may be less than 0.05 μm. In some embodiments, the thicknesses T4_1 and T4_2 may be the same, but in other embodiments, the thicknesses T4_1 and T4_2 may be different.

In some embodiments, the average germanium concentration of the unit structure 174 may be higher than the first concentration of the first buffer layer 171 and lower than the second concentration of the second buffer layer 172. For example, the germanium concentration of the second layer 174_2 of the unit structure 174 may be higher than the first concentration of the first buffer layer 171 and lower than the second concentration of the second buffer layer 172. For example, the germanium concentration of the first and second layers 174_1 and 174_2 of the unit structure 174 may be between about 15 and about 50 atomic percent. However, the present disclosure is not limited thereto.

Figure 8:
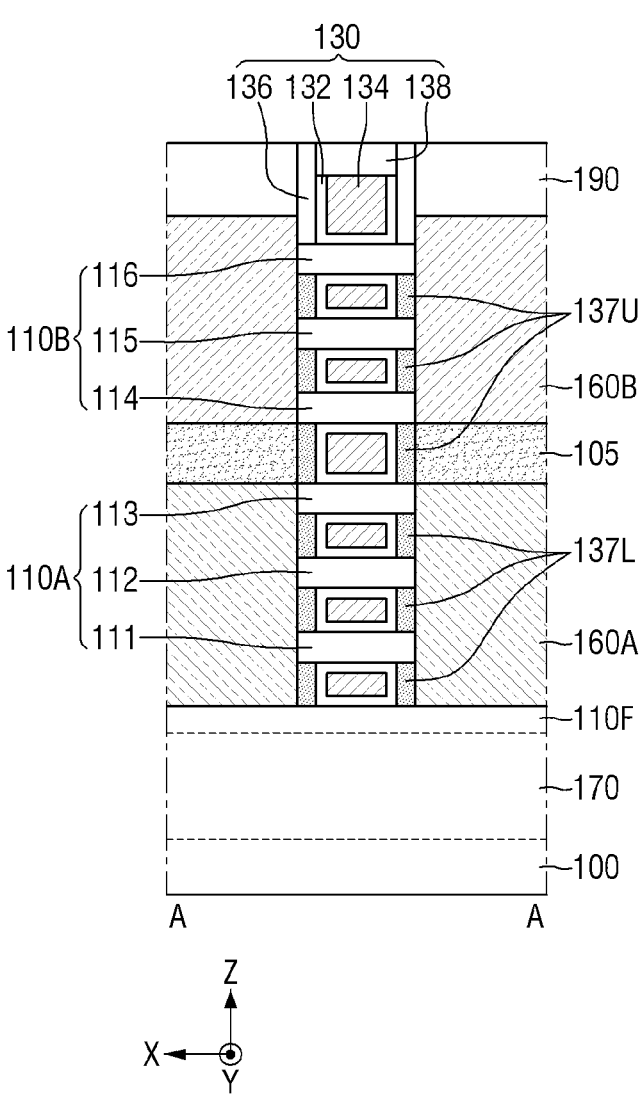
FIG. 8 is a cross-sectional view illustrating a semiconductor device according to example embodiments.

FIG. 8 is a cross-sectional view illustrating a semiconductor device according to example embodiments. For simplicity of description, redundant parts of the description made with reference to FIGS. 1 to 4 may be recapitulated or omitted.

Referring to FIG. 8, the semiconductor device according to some embodiments further includes an upper inner spacer 137U.

The upper inner spacer 137U may be formed between the upper sheet patterns (e.g., the fourth to sixth sheet patterns 114, 115, 116). Further, the upper inner spacer 137U may be interposed between the gate electrode 134 and the second source/drain region 160B. The upper inner spacer 137U may electrically separate the gate electrode 134 from the second source/drain region 160B.

The upper inner spacer 137U may include, for example, at least one of silicon nitride, silicon oxynitride, silicon oxycarbide, silicon boron nitride, silicon boron carbonitride, silicon oxycarbonitride, or a combination thereof, but is not limited thereto. The upper inner spacer 137U may include the same material as that of the gate spacer 136 or a material different from that of the gate spacer 136. For example, the upper inner spacer 137U may have a dielectric constant greater than the dielectric constant of the gate spacer 136.

In some embodiments, the element formed by the first active pattern 110A may be a p-type (e.g., PFET), and the element formed by the second active pattern 110B may be an n-type (e.g., NFET).

Referring to FIG. 8, the semiconductor device according to some embodiments further includes a lower inner spacer 137L.

The lower inner spacer 137L may be formed between the lower sheet patterns (e.g., the first to third sheet patterns 111, 112, 113). Further, the lower inner spacer 137L may be between the gate electrode 134 and the first source/drain region 160A. The lower inner spacer 137L may electrically separate the gate electrode 134 from the first source/drain region 160A.

The lower inner spacer 137L may include, for example, at least one of silicon nitride, silicon oxynitride, silicon oxycarbide, silicon boron nitride, silicon boron carbonitride, silicon oxycarbonitride, or a combination thereof, but is not limited thereto. The lower inner spacer 137L may include the same material as that of the gate spacer 136 or a material different from that of the gate spacer 136.

In some embodiments, the element formed by the first active pattern 110A may have a first conductivity type, and the element formed by the second active pattern 110B may have a second conductivity type that is different from the first conductivity type. As an example, the first conductivity type may be a p-type and the second conductivity type may be an n-type. As another example, the first conductivity type may be an n-type and the second conductivity type may be a p-type.

Figure 9:
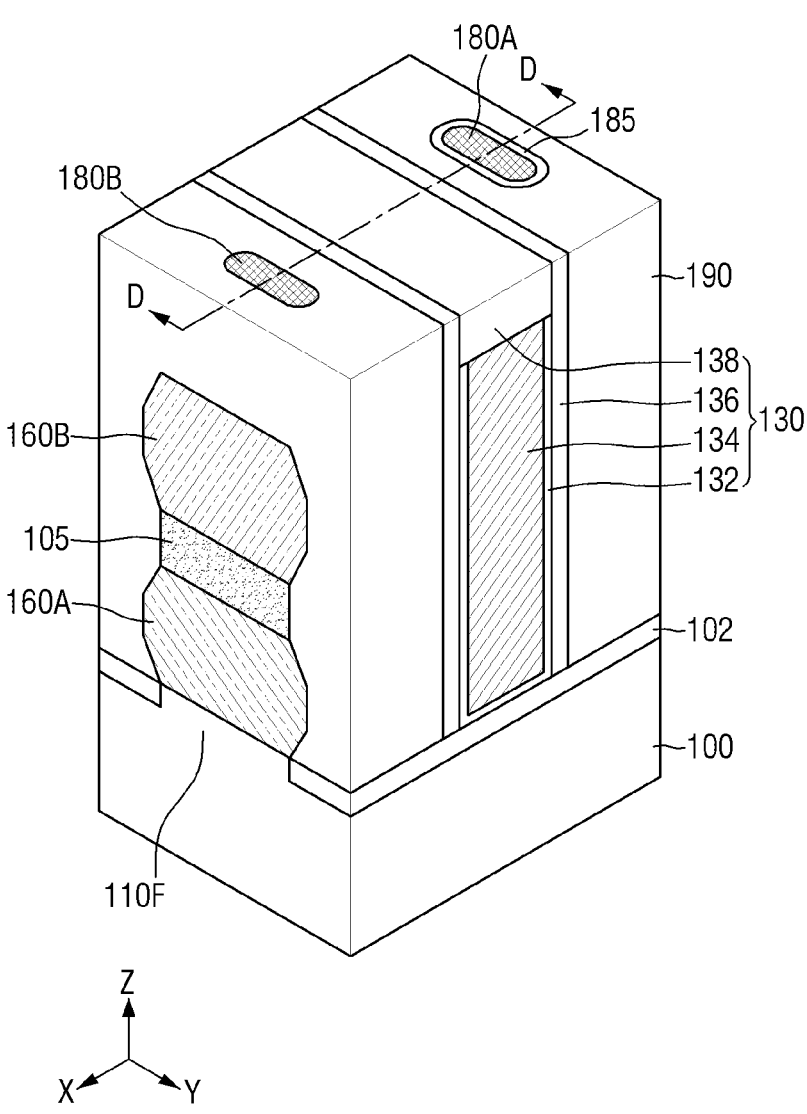
FIG. 9 is a perspective view illustrating a semiconductor device according to example embodiments.
Figure 10:
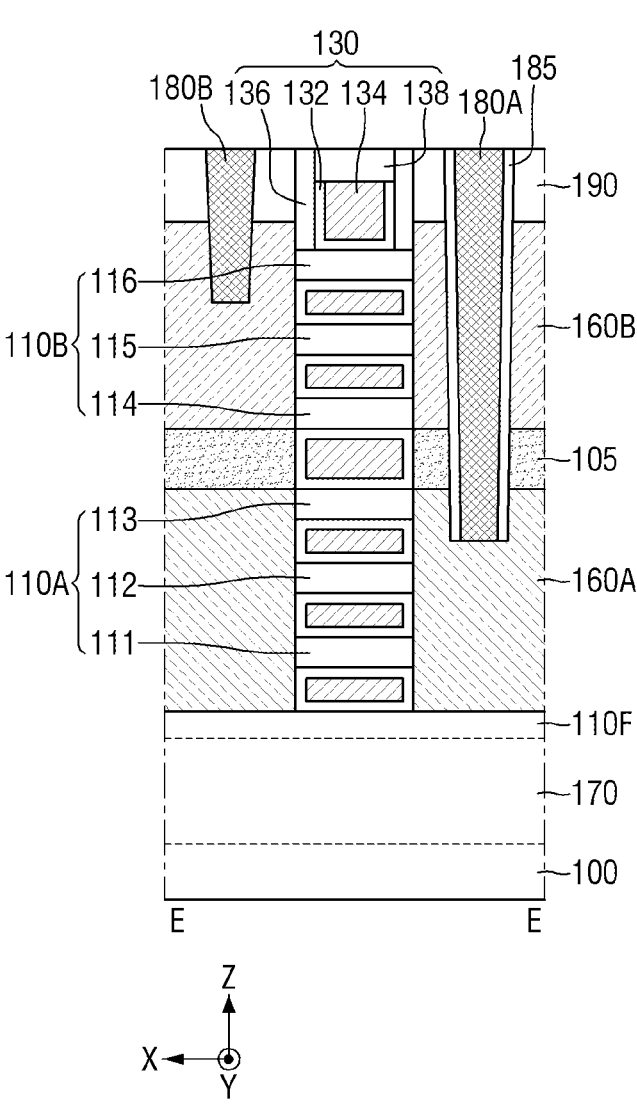
FIG. 10 is a cross-sectional view taken along line D-D of FIG. 9.

FIG. 9 is a perspective view illustrating a semiconductor device according to example embodiments. FIG. 10 is a cross-sectional view taken along line D-D of FIG. 9. For simplicity of description, redundant parts of the description made with reference to FIGS. 1 to 4 may be recapitulated or omitted.

Referring to FIGS. 9 and 10, the semiconductor device according to some embodiments further includes a first source/drain contact 180A and a second source/drain contact 180B.

The first source/drain contact 180A may be connected to the first source/drain region 160A. For example, the first source/drain contact 180A may extend in the third direction Z to pass through the interlayer insulating layer 190, the second source/drain region 160B, and the insulating structure 105, and be in contact with the first source/drain region 160A.

In some embodiments, a contact spacer 185 may be formed to extend along a side surface of the first source/drain contact 180A. The contact spacer 185 may electrically separate the first source/drain contact 180A from the second source/drain region 160B. Accordingly, the first source/drain contact 180A may be connected only to the first source/drain region 160A and may not be connected to the second source/drain region 160B.

In some other embodiments, the contact spacer 185 may be omitted. In this case, the first source/drain contact 180A may be connected to both the first source/drain region 160A and the second source/drain region 160B. That is, the first source/drain contact 180A may function as a shared source/drain contact.

The second source/drain contact 180B may be connected to the second source/drain region 160B. For example, the second source/drain contact 180B may extend in the third direction Z to pass through the interlayer insulating layer 190 and be in contact with the second source/drain region 160B.

Hereinafter, a method for fabricating a semiconductor device according to exemplary embodiments will be described with reference to FIGS. 11 to 18.

FIGS. 11 to 18 are views illustrating the intermediate steps of a method for fabricating a semiconductor device according to example embodiments. For simplicity of description, redundant parts of the description made with reference to FIGS. 1 to 10 may be recapitulated or omitted.

Figure 11:
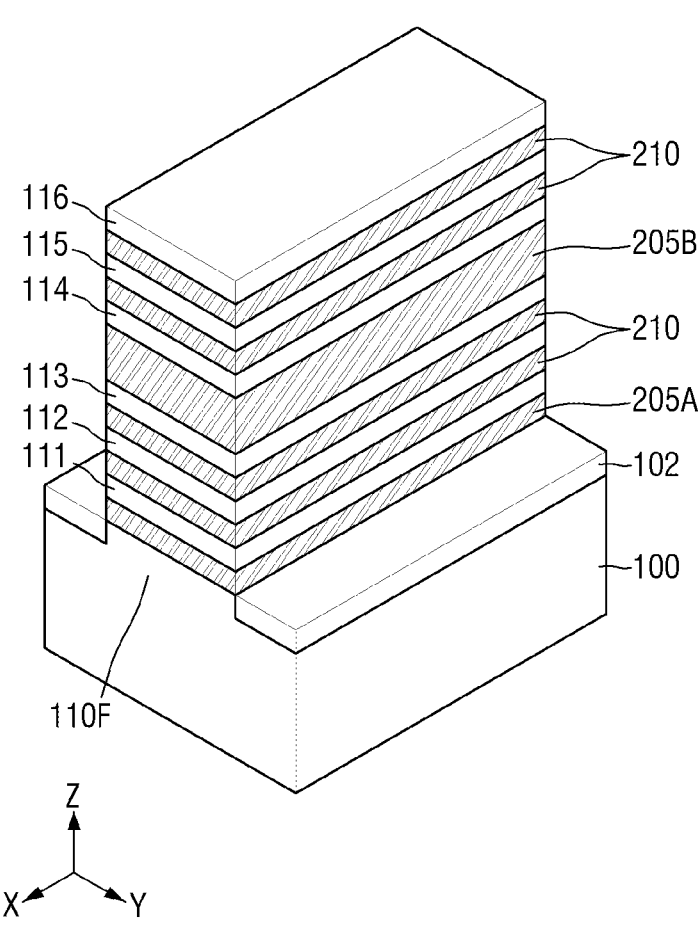
FIGS. 11 to 18 are views illustrating the intermediate steps of a method for fabricating a semiconductor device according to example embodiments.

Referring to FIG. 11, the plurality of sheet patterns 111 to 116 and the plurality of sacrificial patterns 205A, 205B, and 210 are formed on the substrate 100.

For example, a first material layer and a second material layer may be formed to be alternately stacked on the substrate 100. Subsequently, a mask pattern may be formed on the first material layer and the second material layer to extend in the first direction X. Then, a patterning step of patterning the first material layer and the second material layer may be performed using the mask pattern as an etching mask.

The patterned second material layers may constitute the sheet patterns 111 to 116. The patterned first material layers may constitute the sacrificial patterns 205A, 205B, and 210. For example, the first material layer between the substrate 100 and the first sheet pattern 111 may constitute the first sacrificial pattern 205A. The first material layer between the third sheet pattern 113 and the fourth sheet pattern 114 may constitute the second sacrificial pattern 205B. The first material layers among the first to third sheet patterns 111 to 113 and among the fourth to sixth sheet patterns 114 to 116 may constitute the plurality of third sacrificial patterns 210.

In some embodiments, the sheet patterns 111 to 116 and the sacrificial patterns 205A, 205B, and 210 may have different etching selectivities. For example, the sheet patterns 111 to 116 may contain silicon (Si), and the sacrificial patterns 205A, 205B, and 210 may contain silicon germanium (SiGe).

In some embodiments, in the step of patterning the first material layer and the second material layer, the substrate 100 may be partially etched to form the fin pattern 110F. Subsequently, the field insulating layer 102 may be formed on the substrate 100. The field insulating layer 102 may cover at least a part of the side surface of the fin pattern 110F.

Figure 12:
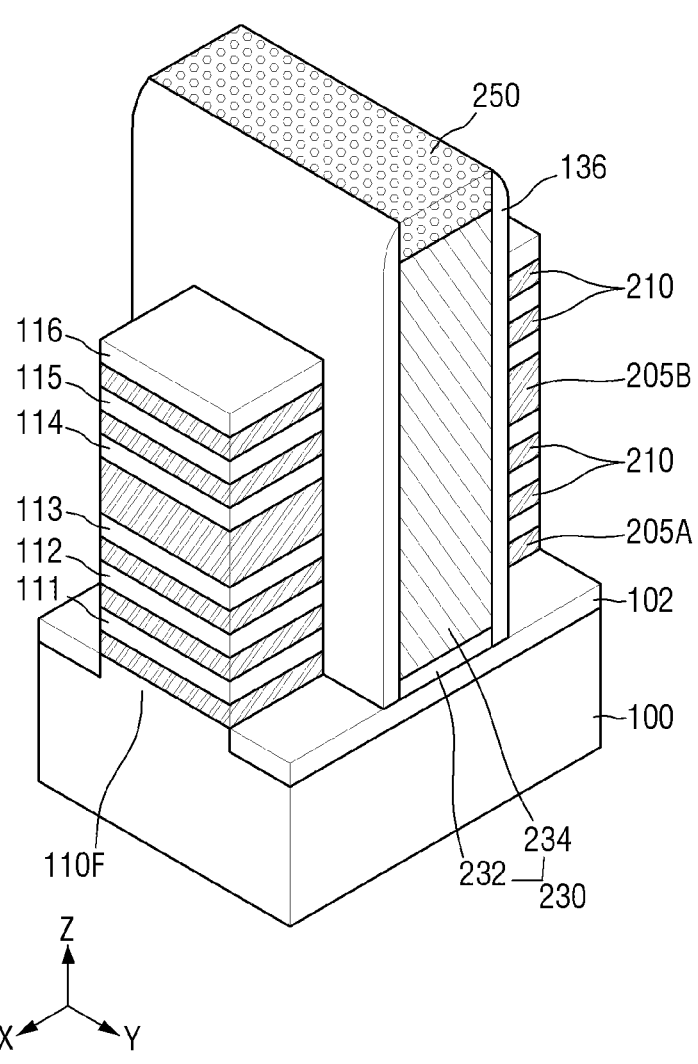

Referring to FIG. 12, a dummy gate structure 230 and the gate spacer 136 are formed on the substrate 100.

The dummy gate structure 230 may be formed on the substrate 100 and the field insulating layer 102. The dummy gate structure 230 may intersect the sheet patterns 111 to 116 and the sacrificial patterns 205A, 205B, and 210. For example, the dummy gate structure 230 may extend in the second direction Y. Each of the sheet patterns 111 to 116 and the sacrificial patterns 205A, 205B, and 210 may extend in the first direction X and pass through the dummy gate structure 230.

The dummy gate structure 230 may include, for example, a dummy gate dielectric layer 232 and a dummy gate electrode 234 sequentially stacked on the substrate 100 and the field insulating layer 102. The dummy gate dielectric layer 232 and the dummy gate electrode 234 may be formed by a patterning step using a mask pattern 250 as an etching mask. For example, a dielectric layer and an electrode layer may be formed to be sequentially stacked on the substrate 100 and the field insulating layer 102. Subsequently, the mask pattern 250 may be formed on the electrode layer to extend in the second direction Y. Thereafter, the patterning step of patterning the dielectric layer and the electrode layer may be performed using the mask pattern 250 as the etching mask. The patterned dielectric layer may constitute the dummy gate dielectric layer 232, and the patterned electrode layer may constitute the dummy gate electrode 234.

The dummy gate electrode 234 may contain a material having a different etching selectivity from that of the sheet patterns 111 to 116 and the sacrificial patterns 205A, 205B, and 210. For example, the dummy gate electrode 234 may contain polysilicon (poly Si).

The gate spacer 136 may be formed on the substrate 100 and the field insulating layer 102. The gate spacer 136 may extend along a side surface of the dummy gate structure 230. In some embodiments, the gate spacer 136 may also extend along a side surface of the mask pattern 250.

Although not specifically illustrated, recesses may be formed by partially removing the side surfaces of the sacrificial patterns 205A, 205B, and 210. Accordingly, the sheet patterns 111 to 116 may protrude from the one or more side surfaces of the sacrificial patterns 205A, 205B, and 210 in the first direction X. That is, the lower inner spacer 137L may be formed on the side surface of each of the third sacrificial patterns 210 among the lower sheet patterns (e.g., the first to third sheet patterns 111 to 113). Further, the upper inner spacers 137U may be formed on the side surface of each of the third sacrificial patterns 210 among the upper sheet patterns (e.g., the fourth to sixth sheet patterns 114 to 116). Accordingly, the semiconductor device described above with reference to FIG. 8 may be fabricated.

Figure 13:
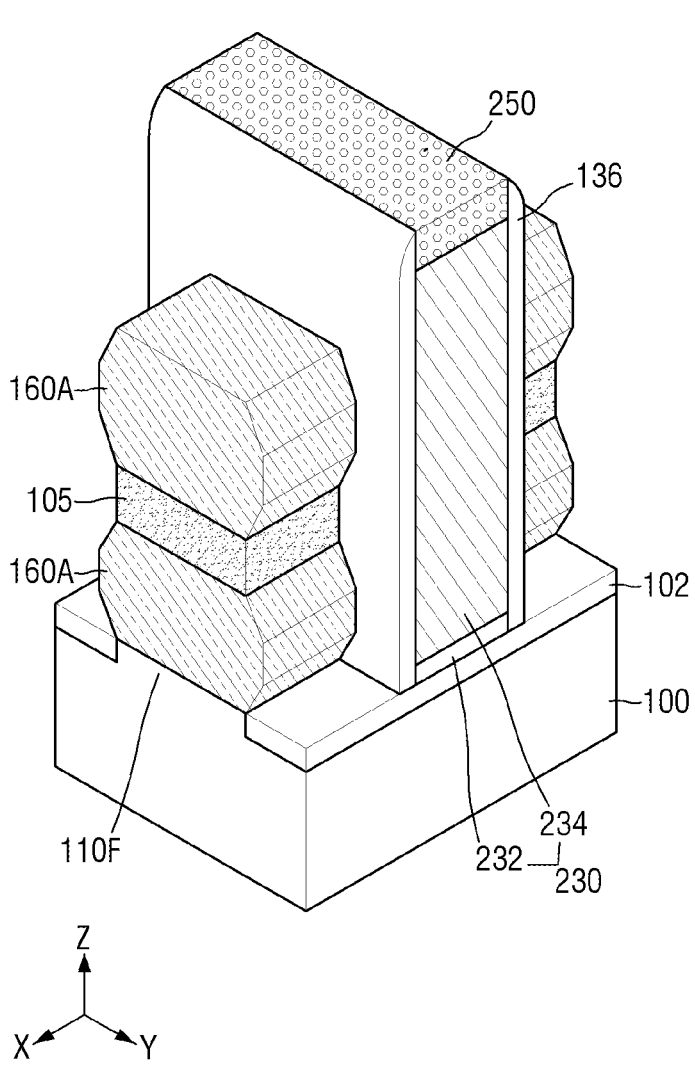

Referring to FIG. 13, the first source/drain region 160A and the insulating structure 105 are formed on the side surface of the dummy gate structure 230.

The first source/drain region 160A may be formed on the insulating structure 105. For example, the first source/drain regions 160A may be formed on the upper side surface and the lower side surface of the dummy gate structure 230 in the third direction Z. Thereafter, the first source/drain region 160A on the upper side surface of the dummy gate structure 230 may be removed while leaving only the first source/drain region 160A on the lower side surface thereof. Then, the insulating structure 105 may be formed on the first source/drain region 160A on the lower side surface. However, the present disclosure is not limited thereto. Although not specifically illustrated, as another example, recesses are formed by removing the sacrificial patterns between the substrate 100 and the first sheet pattern 111, and between the third sheet pattern 113 and the fourth sheet pattern 114, and then the insulating structures 105 may be disposed in the recesses to be spaced apart from each other. Thereafter, the first source/drain region 160A may be formed between the insulating structures 105 spaced apart from each other.

Through this, the first source/drain region 160A may be formed to be connected to the first active pattern 110A and the second active pattern 110B. The first source/drain region 160A may be formed by, for example, the epitaxial growth method.

Figure 14:
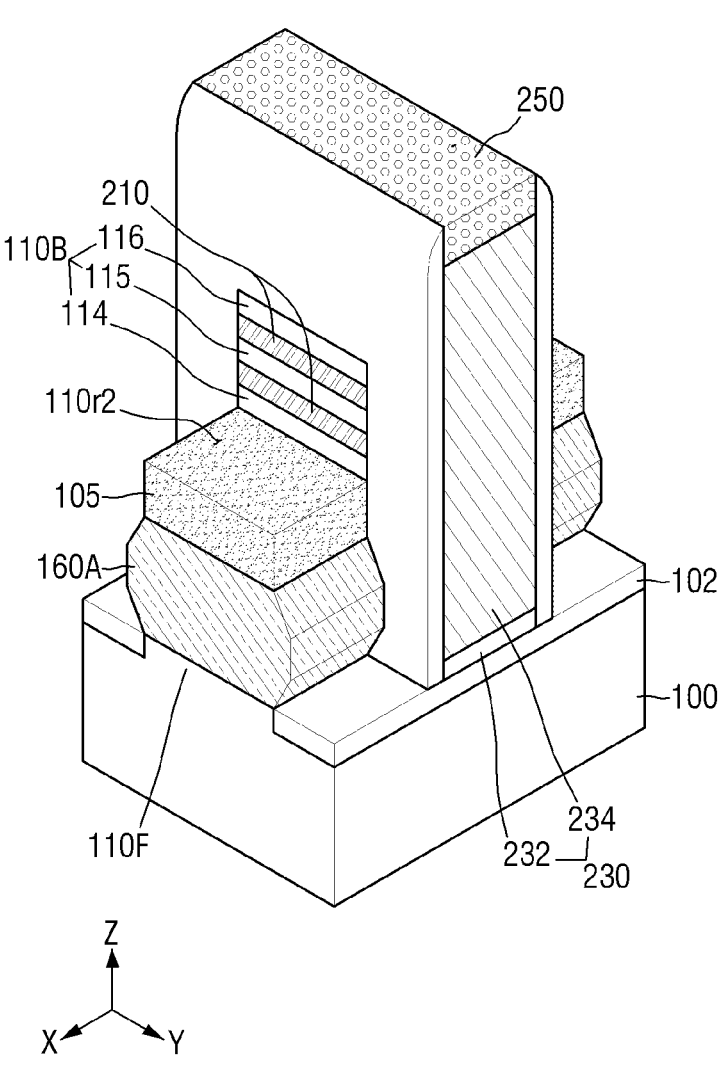

Referring to FIG. 14, the first source/drain region 160A on the top surface of the insulating structure 105 is removed.

For example, an etching step of removing the first source/drain region 160A on the top surface of the insulating structure 105 may be performed. The etching step may include, for example, a dry etching step, but is not limited thereto. Accordingly, a recess 110r2 may be formed on the top surface of the insulating structure 105. The recess 110r2 may expose the second active pattern 110B.

Figure 15:
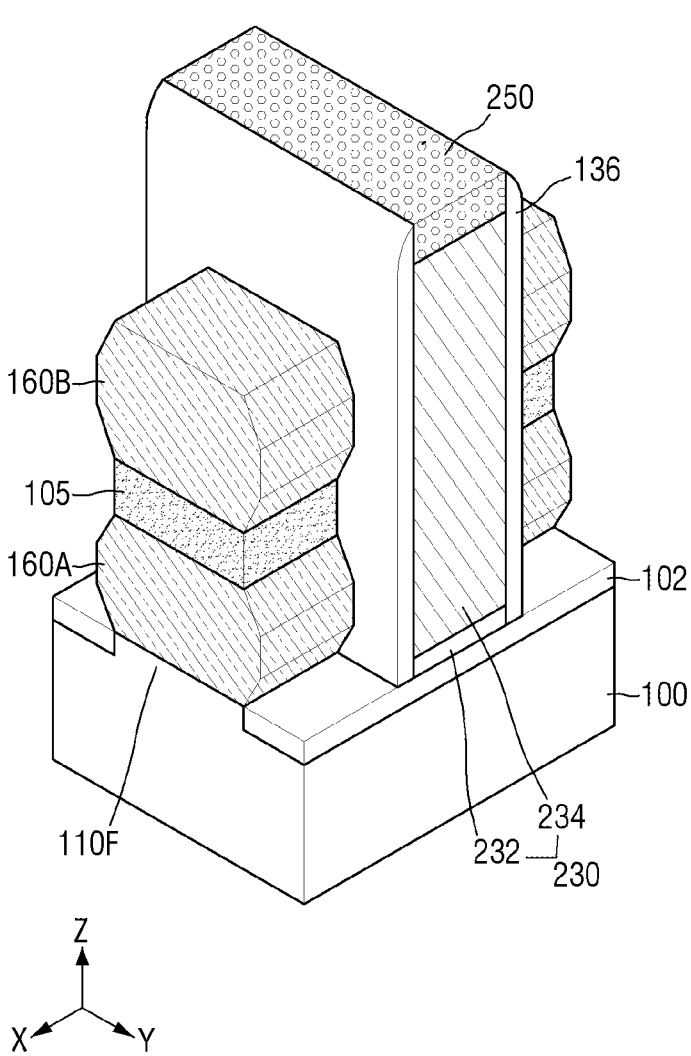

Referring to FIG. 15, the second source/drain region 160B is formed on the side surface of the dummy gate structure 230.

The second source/drain region 160B may be formed on the top surface of the insulating structure 105. For example, the second source/drain region 160B may fill the recess 110r2 of FIG. 14. Through this, the second source/drain region 160B may be formed to be connected to the second active pattern 110B. The second source/drain region 160B may be formed by, for example, the epitaxial growth method.

Figure 16:
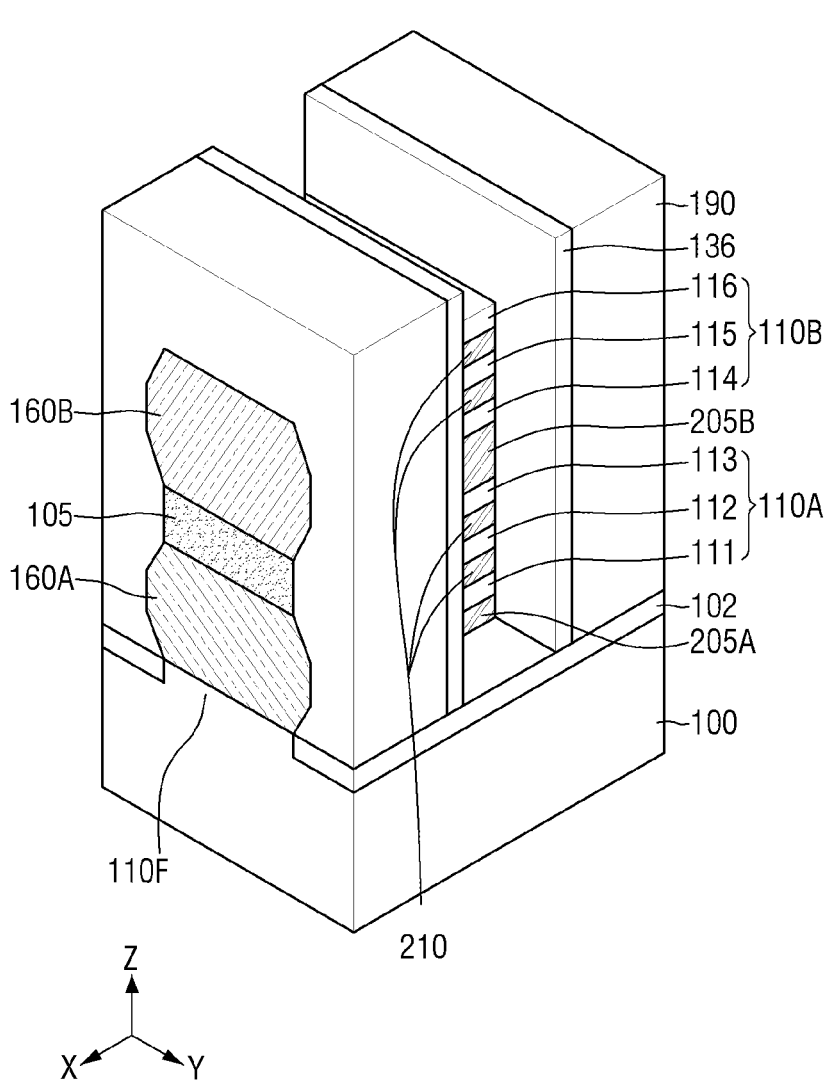

Referring to FIG. 16, the dummy gate structure 230 is removed.

For example, the interlayer insulating layer 190 may be formed on the substrate 100 and the field insulating layer 102. The interlayer insulating layer 190 may be formed to fill the space on the outer surface of the gate spacer 136. For example, the interlayer insulating layer 190 may cover at least a portion of the first source/drain region 160A, at least a portion of the second source/drain region 160B, and at least a portion of the insulating structure 105.

Subsequently, the mask pattern 250 and the dummy gate structure 230 exposed by the interlayer insulating layer 190 and the gate spacer 136 may be removed. The dummy gate structure 230 may be selectively removed. As the dummy gate structure 230 is removed, the sheet patterns 111 to 116 and the sacrificial patterns 205A, 205B, and 210 disposed inside the gate spacer 136 may be exposed.

Figure 17:
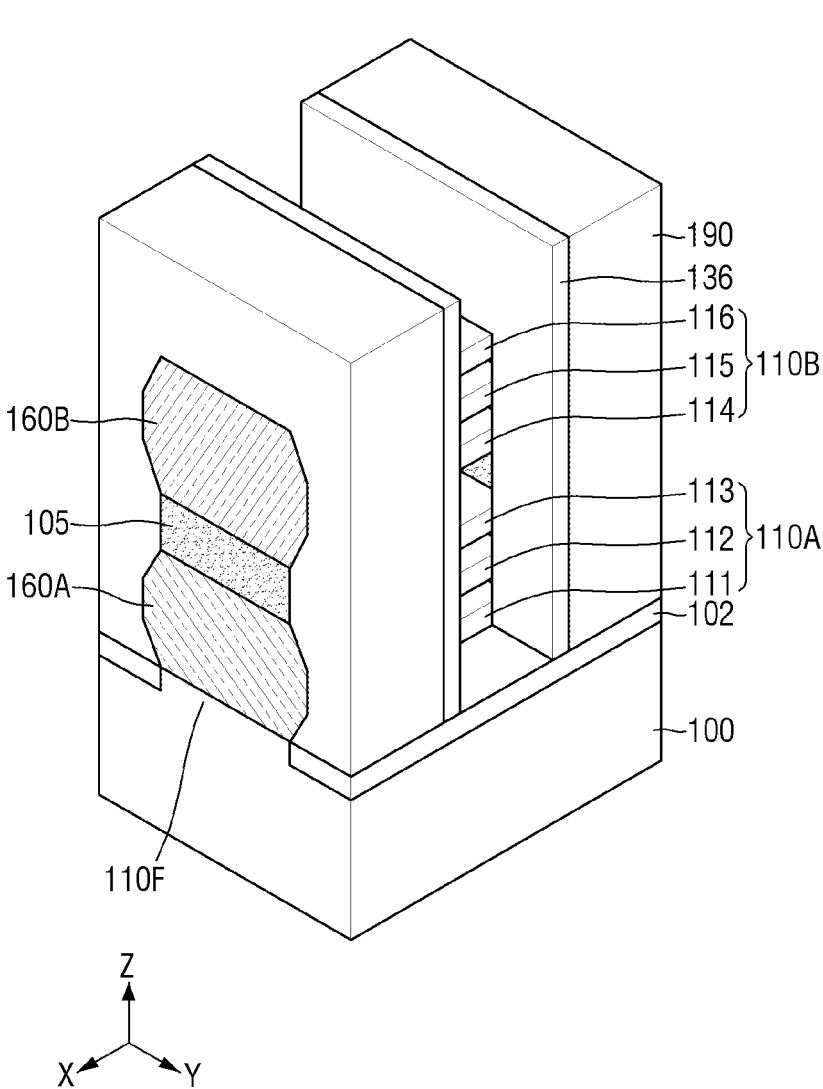

Referring to FIG. 17, the sacrificial patterns 205A, 205B, and 210 are removed.

The sheet patterns 111 to 116 and the sacrificial patterns 205A, 205B, and 210 may have different etching selectivities. Accordingly, the sacrificial patterns 205A, 205B, and 210 may be selectively removed. As the sacrificial patterns 205A, 205B, and 210 are removed, the sheet patterns 111 to 116 may be formed with spaces therebetween.

Figure 18:
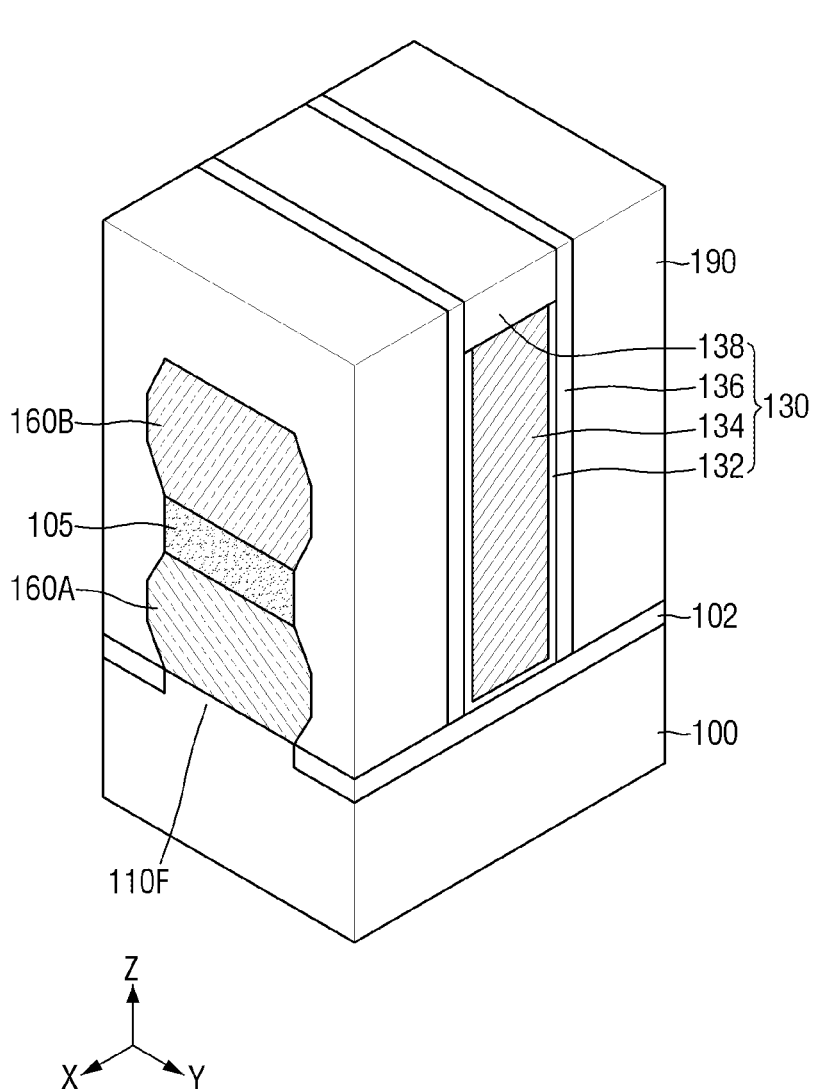

Referring to FIG. 18, the gate structure 130 is formed.

For example, the gate dielectric layer 132 may be formed to conform to, and extend along, the surface of the resultant structure (the surface of the gate spacer 136) of FIG. 17. Subsequently, the gate electrode 134 may be formed on the gate dielectric layer 132. In some embodiments, the top surface of the gate electrode 134 may be recessed. The gate capping pattern 138 may extend along the recessed top surface of the gate electrode 134. Thus, the gate structure 130 including the gate dielectric layer 132, the gate electrode 134, the gate spacer 136, and the gate capping pattern 138 may be formed.

Accordingly, the semiconductor device described above with reference to FIGS. 1 to 4 may be fabricated. After the gate structure 130 is formed, the first source/drain contact 180A and the second source/drain contact 180B may be formed. Accordingly, the semiconductor device described above with reference to FIGS. 9 and 10 may be fabricated.

Figure 19:
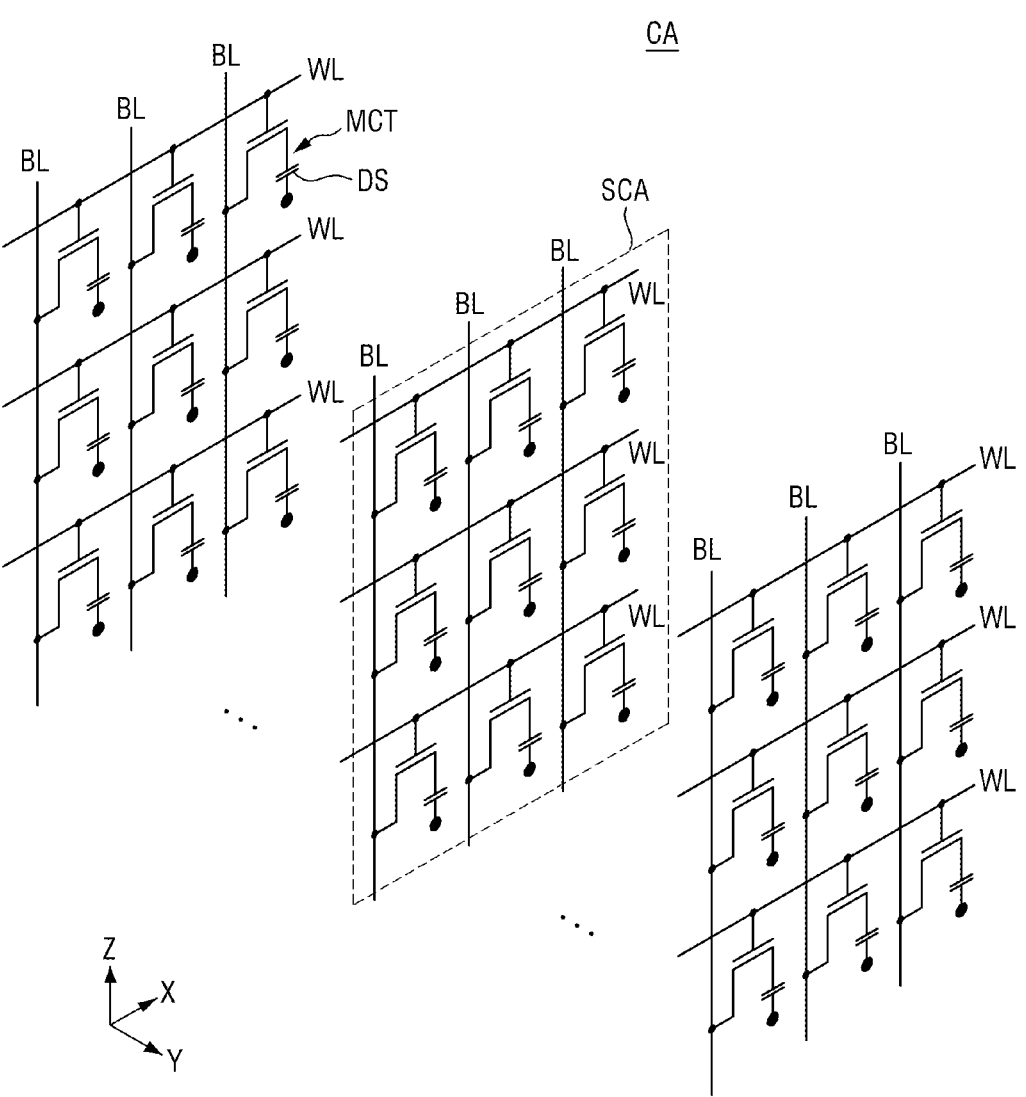
FIG. 19 is a simplified circuit view showing a cell array of a three-dimensional (3D) semiconductor memory device according to example embodiments.

FIG. 19 is a simplified circuit view showing a cell array of a three-dimensional (3D) semiconductor memory device according to example embodiments.

Referring to FIG. 19, a cell array CA of a 3D semiconductor device according to example embodiments may include a plurality of sub-cell arrays SCA. The sub-cell arrays SCA may be arranged along a second direction Y.

Each of the sub-cell arrays SCA may include a plurality of bit lines BL, a plurality of word lines WL, and a plurality of memory cell transistors MCT. One memory cell transistor MCT may be disposed between one word line WL and one bit line BL.

The bit lines BL may be conductive patterns (e.g., metallic conductive lines) extending in a direction (i.e., a third direction Z) perpendicular to the substrate. The bit lines BL in one sub-cell array SCA may be arranged in a first direction X. The bit lines BL adjacent to each other may be spaced apart in the first direction X.

The word lines WL may be conductive patterns (e.g., metallic conductive lines) stacked on the substrate in the third direction Z. Each of the word lines WL may extend in the first direction X. The word lines WL adjacent to each other may be spaced apart in the third direction Z.

The gate of the memory cell transistor MCT may be connected to the word line WL, and a first source/drain SD1 of the memory cell transistor MCT may be connected to the bit line BL. A second source/drain SD2 of the memory cell transistor MCT may be connected to an information storage element DS. In some embodiments, the information storage element DS may be a capacitor. The second source/drain of the memory cell transistor MCT may be connected to the lower electrode of the capacitor.

Figure 20:
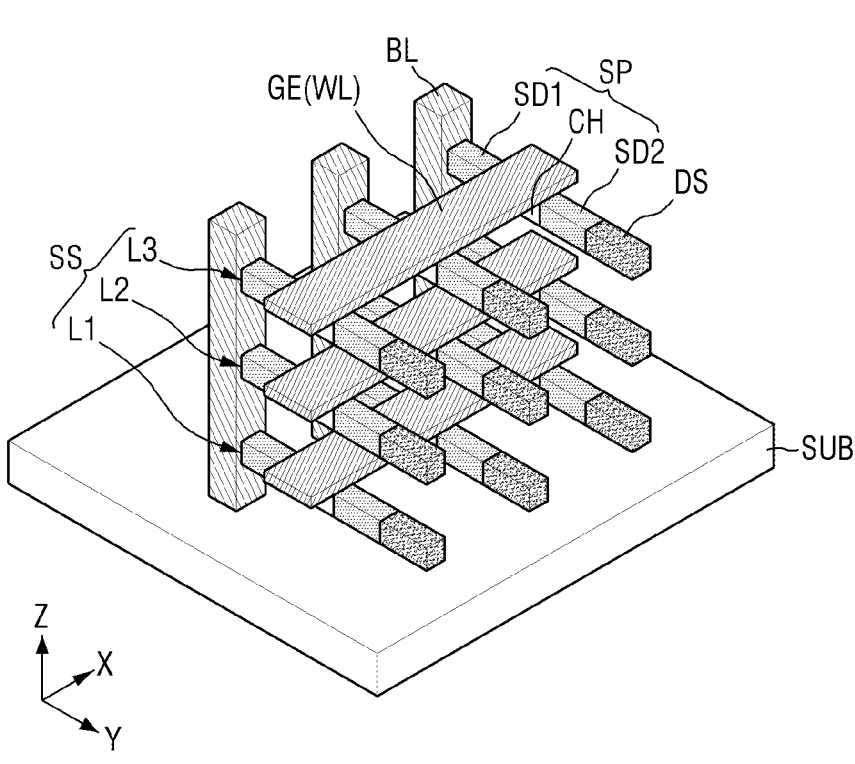
FIG. 20 is a perspective view illustrating a semiconductor device according to example embodiments.
Figure 21:
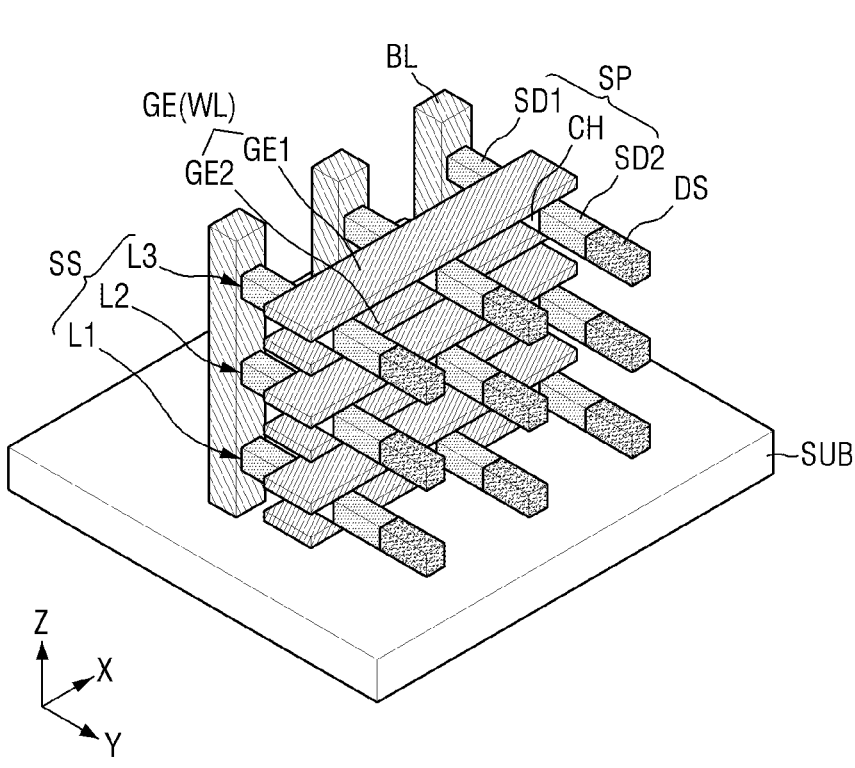
FIG. 21 is a perspective view illustrating a semiconductor device according to example embodiments.
Figure 22:
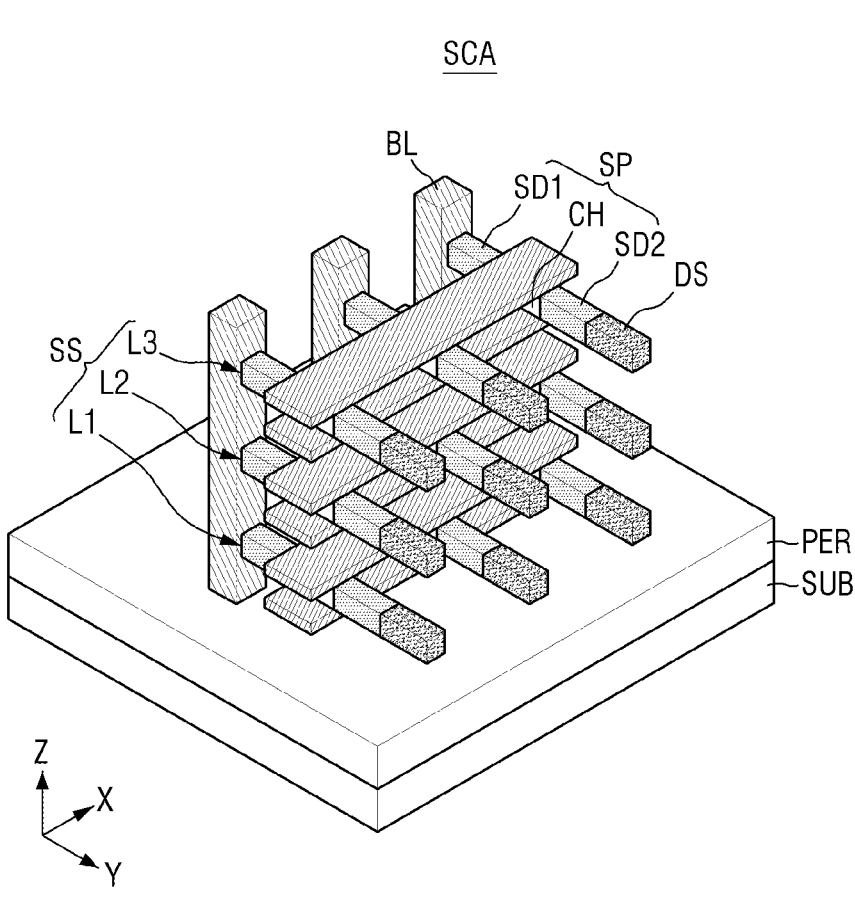
FIG. 22 is a perspective view illustrating a semiconductor device according to example embodiments.
Figure 23:
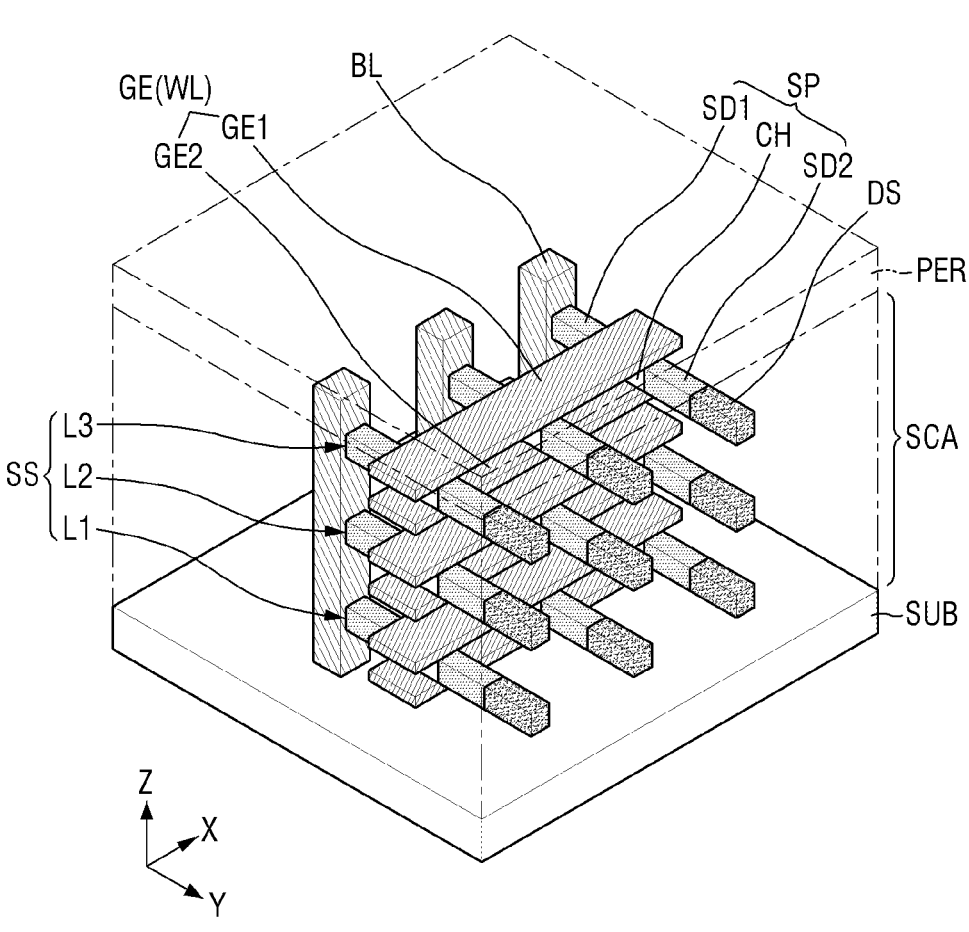
FIG. 23 is a perspective view illustrating a semiconductor device according to example embodiments.

FIG. 20 is a perspective view illustrating a semiconductor device according to example embodiments. FIG. 21 is a perspective view illustrating a semiconductor device according to example embodiments. FIG. 22 is a perspective view illustrating a semiconductor device according to example embodiments. FIG. 23 is a perspective view illustrating a semiconductor device according to example embodiments.

Referring to FIGS. 19 and 20, one of the plurality of sub-cell arrays SCA described with reference to FIG. 19 may be disposed on a substrate SUB.

The substrate SUB may be a bulk silicon or silicon-on-insulator (SOI) substrate. Alternatively, the substrate SUB may be a silicon substrate, or may include other materials such as silicon germanium, silicon germanium on insulator (SGOI), indium antimonide, a lead tellurium compound, indium arsenide, indium phosphide, gallium arsenide, or gallium antimonide, but is not limited thereto. In the following description, the substrate SUB will be described as being a substrate containing silicon.

First to third layers L1, L2, and L3 of a stacked structure SS may be disposed on the substrate SUB. The first to third layers L1, L2, and L3 of the stacked structure SS may be stacked to be spaced apart from each other in a direction (i.e., the third direction Z) perpendicular to the top surface of the substrate SUB. Alternatively, the first to third layers L1, L2, and L3 of the stacked structure SS may be stacked apart from each other in the thickness direction (that is, the third direction Z) of the substrate SUB.

Each of the first to third layers L1, L2, and L3 may include a plurality of semiconductor patterns SP, a plurality of information storage elements DS, and a gate electrode GE.

The semiconductor pattern SP may have a line shape or a bar shape extending in the second direction Y. The semiconductor pattern SP may include a semiconductor material such as silicon, germanium, or silicon-germanium. For example, the semiconductor pattern SP may include at least one of polysilicon, polysilicon germanium, monocrystalline silicon, or monocrystalline silicon-germanium.

Each semiconductor pattern SP may include a channel region CH, a first impurity region SD1, and a second impurity region SD2. The channel region CH may be interposed between the first and second impurity regions SD1 and SD2. The channel region CH may correspond to a channel of the memory cell transistor MCT described with reference to FIG. 19. The first and second impurity regions SD1 and SD2 may correspond to the first source/drain and the second source/drain of the memory cell transistor MCT described with reference to FIG. 1, respectively.

The first and second impurity regions SD1 and SD2 may be regions doped with impurities in the semiconductor pattern SP. Accordingly, the first and second impurity regions SD1 and SD2 may have an n-type or p-type conductivity type. The first impurity region SD1 may be formed adjacent to the first end of the semiconductor pattern SP, and the second impurity region SD2 may be formed adjacent to the second end of the semiconductor pattern SP. The second end may face the first end in the second direction Y.

The first impurity region SD1 may be formed adjacent to the bit line BL. The first impurity region SD1 may be connected to the bit line BL. The second impurity region SD2 may be formed adjacent to the information storage element DS. The second impurity region SD2 may be connected to the information storage element DS.

The information storage element DS may be memory elements capable of storing data. Each information storage element DS may be a memory element using a capacitor, a memory element using a magnetic tunnel junction pattern, or a memory element using a variable resistor including a phase change material. For example, each information storage element DS may be a capacitor.

The gate electrode GE may have a line shape or a bar shape extending in the first direction X. The gate electrodes GE may be stacked to be spaced apart from each other along the third direction Z. Each gate electrode GE may cross the semiconductor pattern SP in one layer and extend in the first direction X. In other words, the gate electrode GE may be the horizontal word lines WL described with reference to FIG. 19.

The gate electrode GE may include a conductive material. For example, the gate electrode GE may include at least one of a doped semiconductor material (doped silicon, doped silicon-germanium, doped germanium, etc.), conductive metal nitride (titanium nitride, tantalum nitride, etc.), metal (tungsten, titanium, tantalum, etc.), or a metal-semiconductor compound (tungsten silicide, cobalt silicide, titanium silicide, etc.), but is not limited thereto.

The plurality of bit lines BL extending in a vertical direction (i.e., the third direction Z) may be provided on the substrate SUB. Each bit line BL may have a line shape or a column shape extending in the third direction Z. The bit line BL may be arranged along the first direction X. Each bit line BL may be electrically connected to the first impurity region SD1 of the vertically stacked semiconductor patterns SP.

The bit line BL may include a conductive material, and may include, for example, at least one of a doped semiconductor material, conductive metal nitride, metal or a metal-semiconductor compound.

The representative first layer L1 among the first to third layers L1, L2, and L3 will be described in detail. The semiconductor patterns SP of the first layer L1 may be arranged in the first direction X. The semiconductor patterns SP of the first layer L1 may be positioned at the same level. The term "level" may mean a height level when viewed with respect to an upper surface of a reference structure, such as the substrate 100. When an Element A is said to be at a "same level" as Element B, this may mean that Element A is a height level that is the same distance from an upper surface of the substrate 100 as Element B. The gate electrode GE of the first layer L1 may cross the semiconductor pattern SP of the first layer L1 and extend in the first direction X. For example, the gate electrode GE of the first layer L1 may be provided on the top surface of the semiconductor pattern SP.

Although not illustrated, a gate insulating layer may be interposed between the gate electrode GE and the channel region CH. The gate insulating layer may include at least one of a high-k insulating layer, a silicon oxide layer, a silicon nitride layer, or a silicon oxynitride layer. For example, the high-k insulating layer may contain at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Each bit line BL may be connected to the first end of the semiconductor pattern SP of the first layer L1. For example, the bit line BL may be directly connected to the first impurity regions SD1. As another example, the bit line BL may be electrically connected to the first impurity region SD1 through metal silicide. A detailed description of the second layer L2 and the third layer L3 may be substantially the same as the first layer L1 described above.

Although not illustrated, empty spaces in the stacked structure SS may be filled with an insulating material. For example, the insulating material may include at least one of a silicon oxide layer, a silicon nitride layer, or a silicon oxynitride layer. A wiring layer electrically connected to the sub-cell array SCA may be disposed on the stacked structure SS.

Although not illustrated, a peripheral circuit for operating the sub-cell array SCA may be formed on the substrate SUB. Using the wiring layer, the peripheral circuit and the sub-cell array may be connected.

As one example, the first direction X, the second direction Y, and the third direction Z may be perpendicular to each other, but are not limited thereto. In addition, the first direction X and the second direction Y may be parallel to the top surface of the substrate SUB, and the third direction Z may be perpendicular to the top surface of the substrate SUB.

Referring to FIGS. 19 and 21, the gate electrode GE may include a first gate electrode GE1 on the top surface of the semiconductor pattern SP and a second gate electrode GE2 on the bottom surface of the semiconductor pattern SP.

In other words, in the semiconductor device according to some embodiments, the memory cell transistor may be a double gate transistor in which the gate electrode GE is provided on both surfaces of the channel region CH.

Referring to FIGS. 19 and 22, a peripheral circuit area PER and the sub-cell array SCA may be stacked in a vertical direction (i.e., the third direction Z).

In FIG. 22, the peripheral circuit area PER may be between the substrate SUB and the plurality of sub-cell arrays SCA.

The peripheral circuit area PER may include peripheral circuit transistors formed on the substrate SUB. The peripheral circuit area PER may include a circuit for operating a 3D semiconductor memory device according to some embodiments.

The sub-cell array SCA described with reference to FIG. 21 may be disposed on the peripheral circuit area PER. Specifically, the stacked structure SS including the first to third layers L1, L2, and L3 may be on the peripheral circuit area PER.

The wiring layer electrically connected to the sub-cell array SCA may be electrically connected to the peripheral circuit area PER through, for example, a through contact.

In FIG. 23, the sub-cell array SCA may be on the substrate SUB. The peripheral circuit area PER may be on the sub-cell array SCA.

As described above, the peripheral circuit area PER may include a circuit for operating the sub-cell array SCA.

For example, the peripheral circuit area PER may be electrically connected to the sub-cell array SCA through, for example, a through contact.

As another example, the peripheral circuit area PER may include a peripheral circuit wiring layer electrically connected to a circuit for operating the sub-cell array SCA. The wiring layer electrically connected to the sub-cell array SCA may be disposed so that the wiring layer and the peripheral circuit wiring layer of the peripheral circuit area PER face each other. Using the wafer bonding method, the wiring layer electrically connected to the sub-cell array SCA may be electrically connected to the peripheral circuit wiring layer of the peripheral circuit area PER.

FIGS. 24 to 27 are various views for explaining a semiconductor device according to some embodiments.

Figure 24:
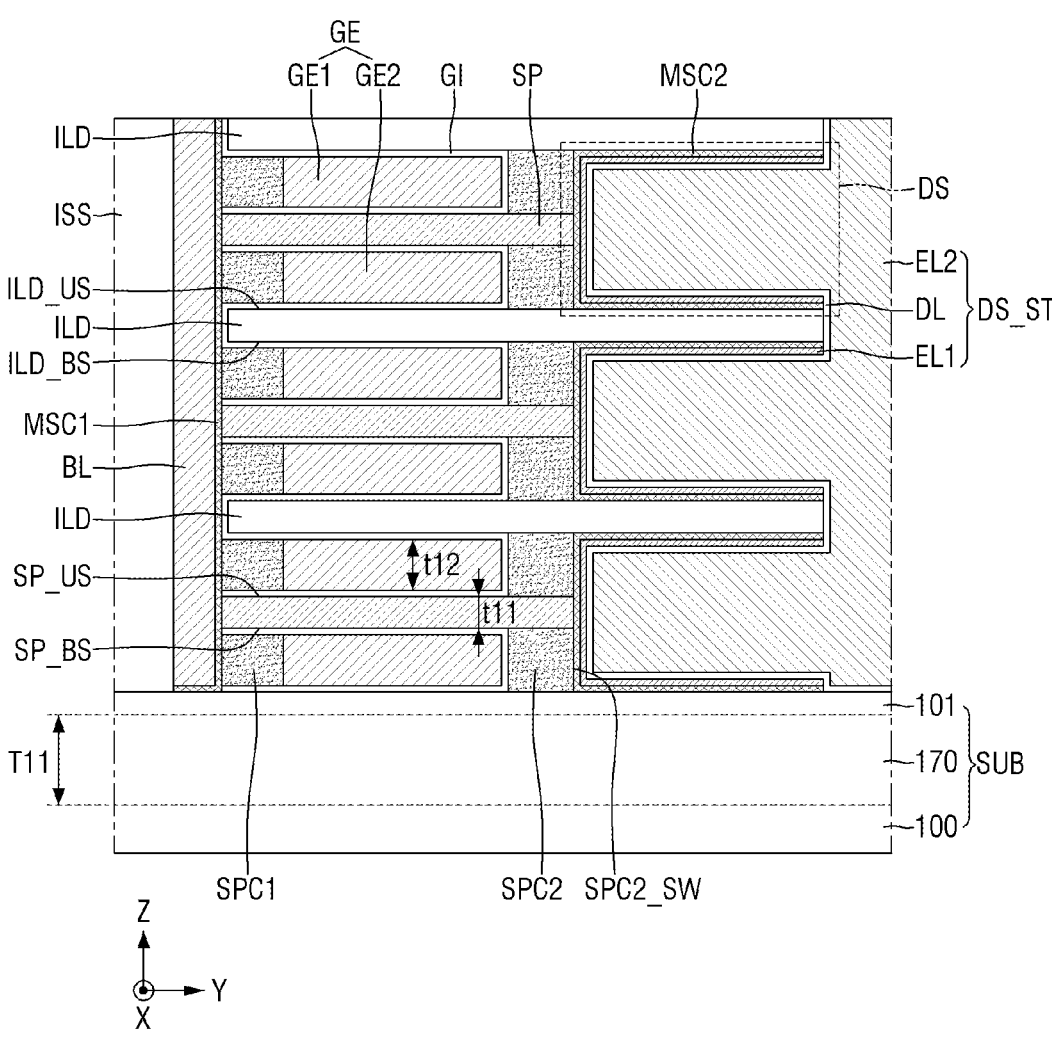
FIGS. 24 to 27 are various views for explaining a semiconductor device according to example embodiments.

For reference, FIG. 24 may be an exemplary cross-sectional view of portions of the semiconductor patterns SP stacked in the third direction Z in FIG. 20 taken along the second direction Y.

For simplicity of description, redundant parts of the description made with reference to FIGS. 19 to 23 may be recapitulated, and the following description is mainly directed to differences.

Referring to FIGS. 24 to 27, a semiconductor memory device according to some embodiments may include the bit line BL, the gate electrode GE, the semiconductor pattern SP, the information storage element DS, and the buffer layer 170.

Referring to FIGS. 24 to 27, the substrate SUB may be provided.

The bit lines BL may be conductive patterns (e.g., metallic conductive lines) extending in a direction (i.e., a third direction Z) perpendicular to the substrate SUB.

A separation insulating structure ISS may be on the substrate SUB. The separation insulating structure ISS may spatially separate the bit line BL adjacent in the second direction Y. The separation insulating structure ISS may include, for example, an insulating material.

The substrate SUB may include a base substrate 100, the buffer layer 170, and an insulating layer 101. The buffer layer 170 may be between the base substrate 100 and the insulating layer 101 on the base substrate 100.

The insulating layer 101 may protrude from the top surface of the base substrate 100 and extend in the first direction X and the second direction Y. The insulating layer 101 may include, for example, silicon (Si). However, the present disclosure is not limited thereto.

The buffer layer 170 may be between the base substrate 100 and the semiconductor patterns SP.

The thickness T11 of the buffer layer 170 may be greater than a thickness t11 of each of the semiconductor patterns SP and a thickness t12 of each of the gate electrodes GE. For example, the thickness T11 of the buffer layer 170 may be greater than 0.05 μm and less than 15 μm.

The buffer layer 170 may include silicon germanium (SiGe). When the buffer layer 170 includes germanium (Ge), the germanium concentration of the buffer layer 170 may be less than 30 atomic percent. The buffer layer 170 may have a higher germanium concentration at a region closer to the semiconductor patterns SP. Although not specifically illustrated, the germanium concentration of the buffer layer 170 may be lower than the germanium concentration of sacrificial layers for forming the gate electrodes GE.

A plurality of mold insulating layers ILD may be on the substrate SUB. Each mold insulating layer ILD may be spaced apart from each other in the third direction Z. Although it is illustrated that there are three mold insulating layers ILD, they are for simplicity of description only, and are not limited thereto.

Each mold insulating layer ILD may include a top surface ILD US and a bottom surface ILD_BS that are opposite to each other in the third direction Z. The plurality of mold insulating layers ILD may include a first mold insulating layer ILD and a second mold insulating layer ILD that are adjacent in the third direction Z. The first mold insulating layer ILD may be closer to the substrate SUB than the second mold insulating layer ILD. In this case, the top surface ILD US of the first mold insulating layer may face the bottom surface ILD_BS of the second mold insulating layer.

The mold insulating layer ILD may include an insulating material. The mold insulating layer ILD may include, for example, at least one of a silicon oxide layer, a silicon nitride layer, a silicon oxynitride layer, a carbon-containing silicon oxide layer, a carbon-containing silicon nitride layer, or a carbon-containing silicon oxynitride layer. For example, the mold insulating layer ILD may include a silicon oxide layer.

Although it is illustrated that the mold insulating layer ILD positioned at the lowermost portion is spaced apart from the substrate SUB, and the semiconductor pattern SP and the gate electrode GE are between the mold insulating layer ILD and the substrate SUB, the present disclosure is not limited thereto. Unlike the illustration, for example, the mold insulating layer ILD positioned at the lowermost portion may be in contact with the substrate SUB.

The plurality of semiconductor patterns SP may be between the mold insulating layers ILD adjacent in the third direction Z. Each of the semiconductor patterns SP may be spaced apart from each other in the third direction Z.

In other words, the plurality of semiconductor patterns SP may be spaced apart in the third direction Z on the substrate SUB. The mold insulating layer ILD may be between the semiconductor patterns SP adjacent in the third direction Z.

The mold insulating layer ILD may not be between the semiconductor pattern SP at the lowermost portion and the substrate SUB for simplicity of description, but is not limited thereto.

Each semiconductor pattern SP may extend in the second direction Y. Each semiconductor pattern SP may overlap the top surface ILD US of the mold insulating layer and the bottom surface ILD_BS of the mold insulating layer that face each other, in the third direction Z.

The semiconductor pattern SP may include at least one of polysilicon, polysilicon germanium, monocrystalline silicon, or monocrystalline silicon-germanium.

The gate electrode GE may have a line shape or a bar shape extending in the first direction X. The gate electrode GE may cross the semiconductor pattern SP in one layer and extend in the first direction X.

Specifically, the gate electrode GE may include a first gate electrode GE1 and a second gate electrode GE2. Each of the first gate electrode GE1 and the second gate electrode GE2 may be a metal pattern replacing the sacrificial layer containing silicon germanium (SiGe).

The semiconductor device according to some embodiments of the present disclosure may further include a gate insulating layer GI and spacer patterns SPC1 and SPC2.

The gate insulating layer GI may be disposed between the first gate electrode GE1 and the semiconductor pattern SP, and between the first gate electrode GE1 and the mold insulating layer ILD. The gate insulating layer GI may be disposed between the second gate electrode GE2 and the semiconductor pattern SP, and between the second gate electrode GE2 and the mold insulating layer ILD.

The gate insulating layer GI may be disposed on the sidewall of the first gate electrode GE1 that is adjacent to an information storage element structure DS_ST and extends in the third direction Z. The gate insulating layer GI may be on the sidewall of the second gate electrode GE2 that is adjacent to the information storage element structure DS_ST and extends in the third direction Z. Further, the gate insulating layer GI may be on the sidewall of the mold insulating layer ILD which connects the top surface ILD US of the mold insulating layer to the bottom surface ILD_BS of the mold insulating layer, but is not limited thereto.

The gate insulating layer GI may include, for example, at least one of a high-k insulating layer, a silicon oxide layer, a silicon nitride layer, or a silicon oxynitride layer.

A spacer pattern may include the first spacer pattern SPC1 and the second spacer pattern SPC2.

The first spacer pattern SPC1 may be between the semiconductor pattern SP and the mold insulating layer ILD. The first spacer pattern SPC1 may be on a top surface SP US of the semiconductor pattern and a bottom surface SP_BS of the semiconductor pattern.

The first spacer pattern SPC1 may spatially separate the gate electrode GE and the bit line BL. The gate insulating layer GI may be between the first spacer pattern SPC1 and the semiconductor pattern SP, and between the first spacer pattern SPC1 and the mold insulating layer ILD. Unlike the illustrated example, the gate insulating layer GI may not be between the first spacer pattern SPC1 and the semiconductor pattern SP, and not between the first spacer pattern SPC1 and the mold insulating layer ILD.

The second spacer pattern SPC2 may be between the semiconductor pattern SP and the mold insulating layer ILD. The second spacer pattern SPC2 may be on the top surface SP US of the semiconductor pattern and the bottom surface SP_BS of the semiconductor pattern.

The second spacer pattern SPC2 may be between the gate electrode GE and the information storage element structure DS_ST.

The gate insulating layer GI may not be between the second spacer pattern SPC2 and the semiconductor pattern SP, and between the second spacer pattern SPC2 and the mold insulating layer ILD.

Each of the first spacer pattern SPC1 and the second spacer pattern SPC2 may include at least one of, for example, a silicon oxide layer, a silicon nitride layer, a silicon oxynitride layer, a carbon-containing silicon oxide layer, a carbon-containing silicon nitride layer, or a carbon-containing silicon oxynitride layer.

A first silicide pattern MSC1 may be between the bit line BL and the semiconductor pattern SP. The first silicide pattern MSC1 may extend along the semiconductor pattern SP, a sidewall of the first spacer pattern SPC1, and a sidewall of the mold insulating layer ILD.

The first silicide pattern MSC1 may be in contact with one or more of the plurality of semiconductor patterns SP. The first silicide pattern MSC1 may be in contact with one or more of the plurality of semiconductor patterns SP spaced apart in the third direction Z.

A second silicide pattern MSC2 may be on the sidewall of the semiconductor pattern SP. The second silicide pattern MSC2 may extend along the semiconductor pattern SP, the mold insulating layer ILD, and a sidewall SPC2_SW of the second spacer pattern SPC2.

The second silicide pattern MSC2 may be in contact with one or more of the plurality of semiconductor patterns SP. The second silicide pattern MSC2 may be in contact with one or more of the plurality of semiconductor patterns SP spaced apart in the third direction Z.

The second silicide pattern MSC2 may also extend in the second direction Y. The second silicide pattern MSC2 may extend parallel to the top surface ILD US and the bottom surface ILD_BS of the mold insulating layer.

The information storage element structure DS_ST may include the plurality of information storage elements DS. Each information storage element DS may be disposed in the second direction Y from the sidewall SPC2_SW of the second spacer pattern SPC2.

Each information storage element DS may be connected to each semiconductor pattern SP. Each information storage element DS may be connected to each second silicide pattern MSC2. The second silicide pattern MSC2 may be along a boundary between the information storage element DS and the sidewall of the semiconductor pattern SP.

Each of the first silicide pattern MSC1 and the second silicide pattern MSC2 may include a metal silicide material (metal-silicon compound) or a metal nitride silicide material (metal nitride-silicon compound). Each of the first silicide pattern MSC1 and the second silicide pattern MSC2 may include, for example, a silicide material containing one metal of titanium (Ti), niobium (Nb), molybdenum (Mo), tungsten (W), cobalt (Co), platinum (Pt), and erbium (Er), but is not limited thereto.

Each information storage element DS may be a capacitor. The information storage element structure DS_ST including the plurality of information storage elements DS may be a capacitor structure.

The information storage element structure DS_ST may include a capacitor dielectric layer DL, an upper electrode EL2, and a plurality of lower electrodes EL1. Each information storage element DS may include the lower electrode EL1, the capacitor dielectric layer DL, and the upper electrode EL2 that are between the mold insulating layers ILD. Each information storage element DS may be defined by each lower electrode EL1.

Each lower electrode EL1 may be between the mold insulating layers ILD adjacent in the third direction Z. The lower electrode EL1 may be connected to the second silicide pattern MSC2. The lower electrode EL1 may be in contact with the second silicide pattern MSC2.

In the semiconductor memory device according to some embodiments, each lower electrode EL1 may extend along a profile of each second silicide pattern MSC2. In other words, each second silicide pattern MSC2 may extend along a profile of each lower electrode EL1.

The lower electrodes EL1 included in each information storage element DS may be separated from each other.

The capacitor dielectric layer DL may be on the lower electrode EL1. The capacitor dielectric layer DL may extend along the profile of the plurality of lower electrodes EL1. The upper electrode EL2 may be on the capacitor dielectric layer DL. The capacitor dielectric layer DL and the upper electrode EL2 may be sequentially disposed on the lower electrode EL1.

The capacitor dielectric layer DL and the upper electrode EL2 included in each information storage element DS may be connected to each other.

Each of the lower electrode EL1 and the upper electrode EL2 may include, for example, a doped semiconductor material, conductive metal nitride (e.g., titanium nitride, tantalum nitride, niobium nitride, or tungsten nitride), metal (e.g., ruthenium, iridium, titanium, niobium, tungsten, cobalt, molybdenum, or tantalum), conductive metal oxide (e.g., iridium oxide or niobium oxide) and the like, but the present disclosure is not limited thereto. For example, the lower electrode EL1 may include conductive metal nitride, metal, and conductive metal oxide. Conductive metal nitride, metal, and conductive metal oxide may be included in a metallic conductive layer.

The capacitor dielectric layer DL may include, for example, a high-k material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof). In the semiconductor memory device according to some embodiments, the capacitor dielectric layer DL may include a stacked structure in which zirconium oxide, aluminum oxide and zirconium oxide are sequentially stacked. In the semiconductor device according to some embodiments, the capacitor dielectric layer DL may include hafnium (Hf).

Figure 25:
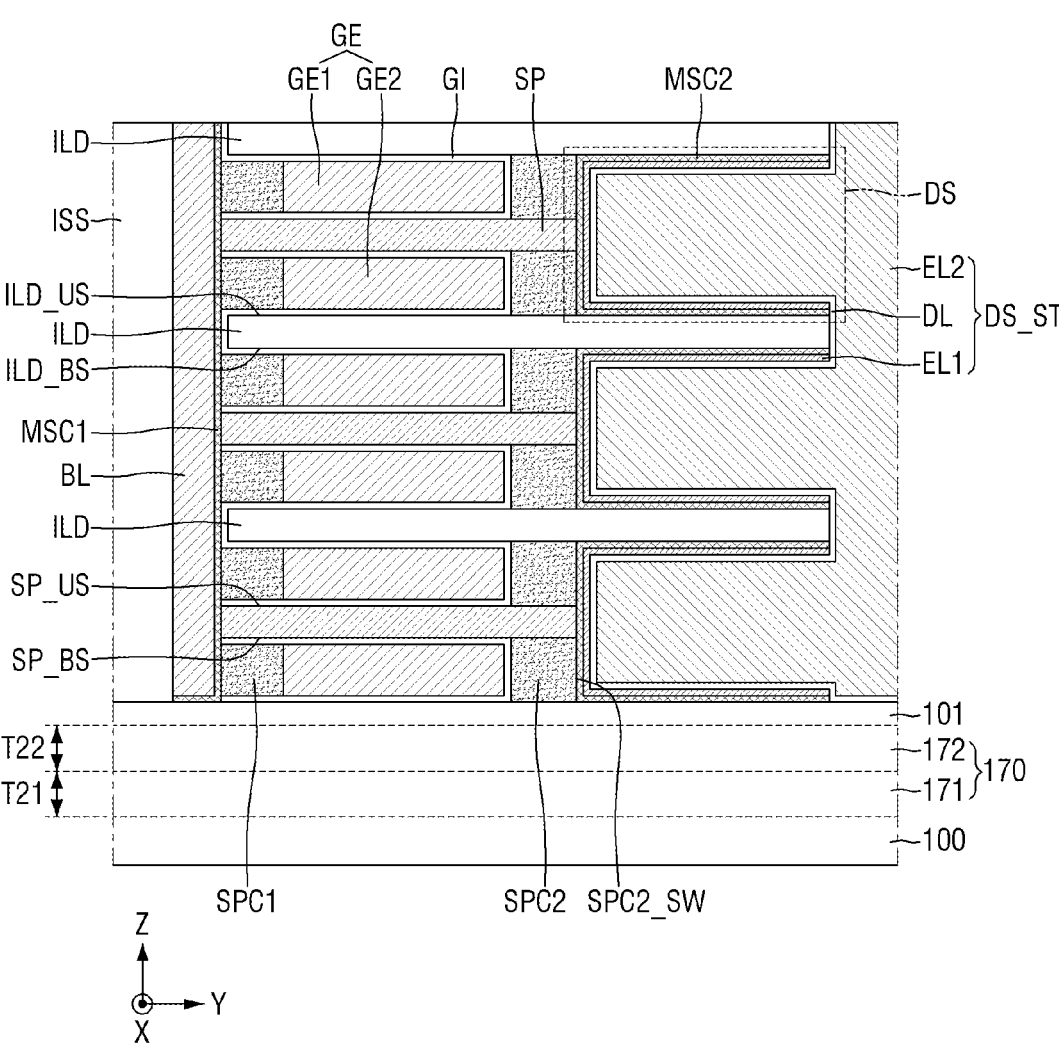

FIG. 25 is a cross-sectional view illustrating a semiconductor device according to example embodiments. For simplicity of description, redundant parts of the description made with reference to FIGS. 19 to 24 may be recapitulated or omitted.

Referring to FIG. 25, the buffer layer 170 may include the first and second buffer layers 171 and 172 sequentially stacked on the base substrate 100, the first and second buffer layers 171 and 172 containing germanium at first and second concentrations, respectively. In some embodiments, the second concentration of the second buffer layer 172 may be higher than the first concentration of the first buffer layer 171. In some embodiments, the first and second buffer layers 171 and 172 may respectively have the thicknesses T21 and T22 greater than 0.05 μm and less than 15 μm. In some embodiments, the thicknesses T21 and T22 may be the same, but in other embodiments, the thicknesses T21 and T22 may be different.

Figure 26:
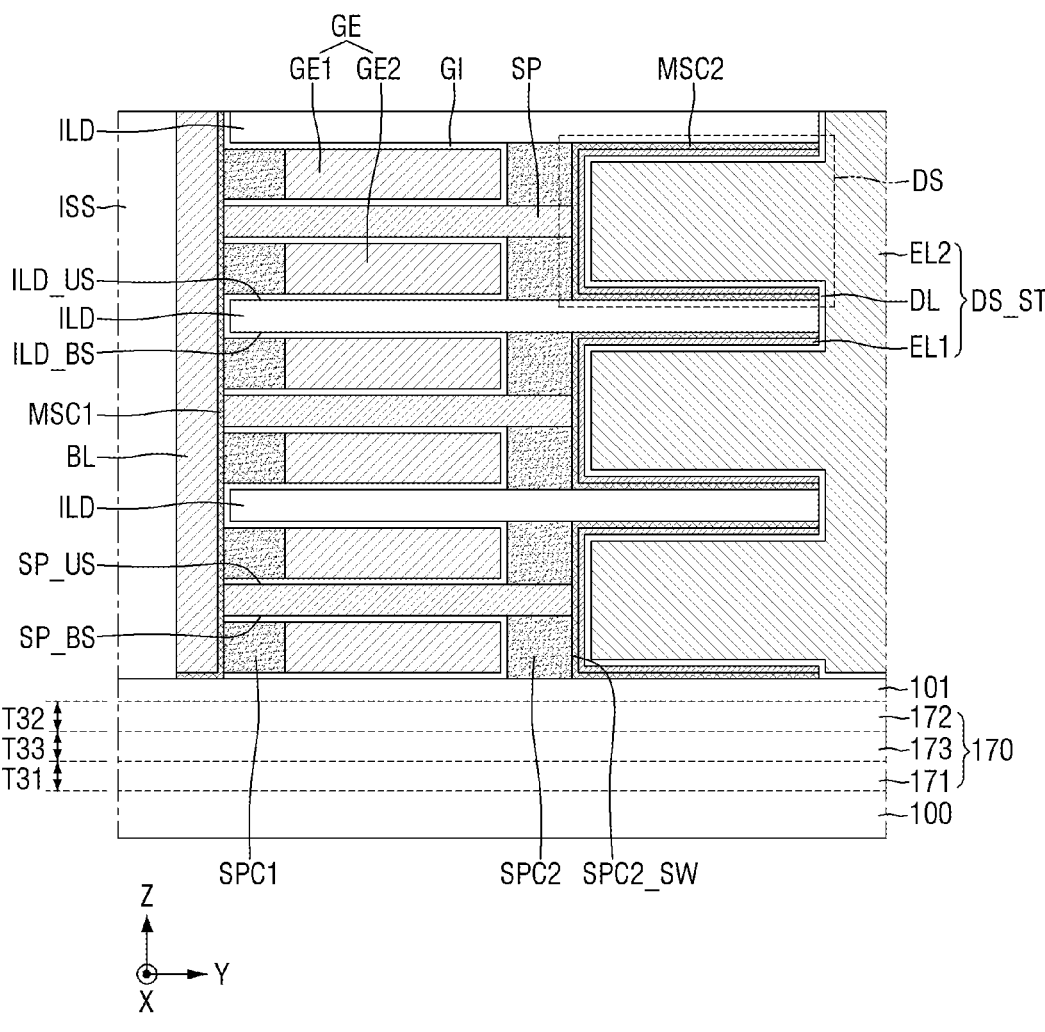

FIG. 26 is a cross-sectional view illustrating a semiconductor device according to example embodiments. For simplicity of description, redundant parts of the description made with reference to FIGS. 19 to 24 may be recapitulated or omitted.

Referring to FIG. 26, the buffer layer 170 may further include the third buffer layer 173 between the first and second buffer layers 171 and 172, the third buffer layer 173 containing germanium at a third concentration. In some embodiments, the third concentration of the third buffer layer 173 may be higher than the first concentration and lower than the second concentration of the second buffer layer 172. In some embodiments, the first to third buffer layers 171, 172, and 173 may respectively have thicknesses T31, T32, and T33 greater than 0.05 μm and less than 15 μm. In some embodiments, the thicknesses T21, T22, and T23 may be the same, but in other embodiments, the thicknesses T21, T22, and T23 may be different.

Figure 27:
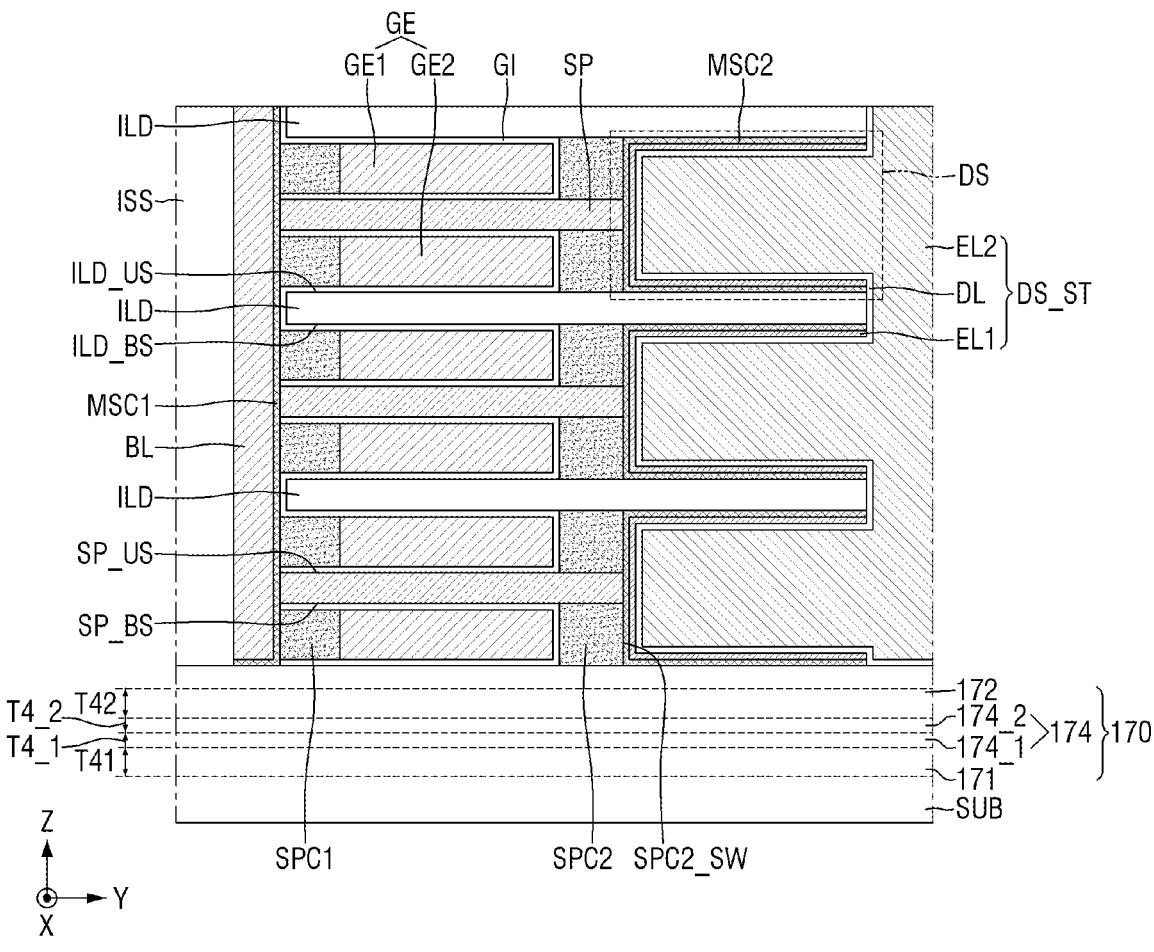

FIG. 27 is a cross-sectional view illustrating a semiconductor device according to example embodiments. For simplicity of description, redundant parts of the description made with reference to FIGS. 19 to 24 may be recapitulated or omitted.

Referring to FIG. 27, the buffer layer 170 may include the unit structure 174 in which the first layer 174_1 containing germanium and the second layer 174_2 containing germanium at a higher concentration than that of the first layer 174_1 are stacked. The unit structure 174 may be disposed between the first and second buffer layers 171 and 172.

Although FIG. 27 shows a single unit structure 174, in some embodiments, a plurality of unit structures 174, each of which includes the first layer 174_1 and the second layer 174_2, may be between the first and second buffer layers 171 and 172. In this case, the plurality of unit structures 174, each of which includes the first layer 174_1 and the second layer 174_2 containing germanium at different concentrations, may be formed by being repeatedly stacked between the first and second buffer layers 171 and 172.

The first and second buffer layers 171 and 172 may respectively have the thicknesses T41 and T42 greater than the thicknesses T4_1 and T4_2 of the first layer 174_1 and the second layer 174_2 of the unit structure 174. For example, each of the thicknesses T4_1 and T4_2 of the first layer 174_1 and the second layer 174_2 may be less than 0.05 μm. In some embodiments, the thicknesses T4_1 and T4_2 may be the same, but in other embodiments, the thicknesses T4_1 and T4_2 may be different.

In some embodiments, the average germanium concentration of the unit structure 174 may be higher than the first concentration of the first buffer layer 171 and lower than the second concentration of the second buffer layer 172. For example, the germanium concentration of the second layer 174_2 of the unit structure 174 may be higher than the first concentration of the first buffer layer 171 and lower than the second concentration of the second buffer layer 172. For example, the germanium concentration of the first and second layers 174_1 and 174_2 of the unit structure 174 may be between about 15 and about 50 atomic percent. However, the present disclosure is not limited thereto.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A semiconductor device comprising:
   a first active pattern spaced apart from a substrate and extending in a first direction;
   a second active pattern spaced apart further from the substrate than the first active pattern and extending in the first direction;
   a gate structure on the substrate, the gate structure extending in a second direction crossing the first direction and penetrating the first active pattern and the second active pattern;
   a first source/drain region on a first portion of a side surface of the gate structure and electrically connected to the first active pattern;
   a second source/drain region on a second portion of the side surface of the gate structure and electrically connected to the second active pattern; and
   a buffer layer between at least a portion of the substrate and the first active pattern, the buffer layer comprising germanium (Ge),
   wherein the substrate includes a fin pattern between the first active pattern and the buffer layer,
   wherein the substrate and the fin pattern are integrated to each other,
   wherein the fin pattern is a monolithic structure,
   wherein the buffer layer is different from the substrate,
   wherein the first source/drain region is between the fin pattern and the second source/drain region, and
   wherein the buffer layer is not in contact with each of the first active pattern and the second active pattern.

2. The semiconductor device of claim 1, wherein a germanium concentration of the buffer layer increases as it gets closer to the first active pattern.

3. The semiconductor device of claim 1, wherein:
   the first active pattern comprises a plurality of lower sheet patterns spaced apart from each other on the substrate, each of the lower sheet patterns extending in the first direction;
   the second active pattern comprises a plurality of upper sheet patterns spaced apart from each other on the first active pattern, each of the upper sheet patterns extending in the first direction; and
   a thickness of the buffer layer is greater than a thickness of each of the plurality of lower and upper sheet patterns.

4. The semiconductor device of claim 1, wherein the buffer layer comprises first and second buffer layers, the first and second buffer layers comprising germanium at first and second concentrations, respectively, and
   wherein the second concentration of the second buffer layer is greater than the first concentration of the first buffer layer.

5. The semiconductor device of claim 4, wherein the buffer layer further comprises a third buffer layer between the first and second buffer layers, the third buffer layer comprising germanium at a third concentration, and
   wherein the third concentration of the third buffer layer is greater than the first concentration of the first buffer layer and less than the second concentration of the second buffer layer.

6. The semiconductor device of claim 4, wherein the buffer layer further comprises a unit structure between the first and second buffer layers, and
   wherein the unit structure comprises a first unit layer comprising germanium at a third concentration and a second unit layer comprising germanium at a fourth concentration that is greater than the third concentration.

7. The semiconductor device of claim 6, wherein an average germanium concentration of the unit structure is greater than the first concentration of the first buffer layer and less than the second concentration of the second buffer layer.

8. The semiconductor device of claim 6, wherein a thickness of each of the first and second buffer layers is greater than a thickness of each of the first and second unit layers of the unit structure.

9. The semiconductor device of claim 1, further comprising an insulating structure between the first source/drain region and the second source/drain region.

10. The semiconductor device of claim 1, wherein the first source/drain region has a first conductivity type, and
    wherein the second source/drain region has a second conductivity type different from the first conductivity type.

11. A semiconductor device comprising:
    a first sheet pattern and a second sheet pattern spaced apart from each other on a substrate, each of the first and second sheet patterns extending in a first direction;
    a third sheet pattern and a fourth sheet pattern spaced apart from each other on the second sheet pattern, each of the third and fourth sheet patterns extending in the first direction;
    a gate structure on the substrate, the gate structure extending in a second direction crossing the first direction and penetrating the first to fourth sheet patterns, the gate structure being between ones of the first to fourth sheet patterns;
    a first source/drain region on a first portion of a side surface of the gate structure and electrically connected to the first sheet pattern and the second sheet pattern;
    a second source/drain region on a second portion of the side surface of the gate structure and electrically connected to the third sheet pattern and the fourth sheet pattern; and
    a buffer layer between at least a portion of the substrate and the first sheet pattern, the buffer layer comprising germanium,
    wherein a thickness of the buffer layer is greater than a thickness of each of the first to fourth sheet patterns,
    wherein the substrate includes a fin pattern between the first sheet pattern and the buffer layer,
    wherein the substrate and the fin pattern are integrated to each other,
    wherein the fin pattern is a monolithic structure,
    wherein the buffer layer is different from the substrate,
    wherein the first source/drain region is between the fin pattern and the second source/drain region, and
    wherein the buffer layer is not in contact with each of the first sheet pattern, the second sheet pattern, the third sheet pattern, and the fourth sheet pattern.

12. The semiconductor device of claim 11, wherein a germanium concentration of the buffer layer increases as it gets closer to the first sheet pattern.

13. The semiconductor device of claim 11, wherein the buffer layer comprises first and second buffer layers, the first and second buffer layers comprising germanium at first and second concentrations, respectively, and
    wherein the second concentration of the second buffer layer is greater than the first concentration of the first buffer layer.

14. The semiconductor device of claim 13, wherein the buffer layer further comprises a third buffer layer between the first and second buffer layers, the third buffer layer comprising germanium at a third concentration, and wherein the third concentration of the third buffer layer is greater than the first concentration of the first buffer layer and less than the second concentration of the second buffer layer.

15. The semiconductor device of claim 13, wherein the buffer layer further comprises a unit structure between the first and second buffer layers, and wherein the unit structure comprises a first unit layer comprising germanium at a third concentration and a second unit layer comprising germanium at a fourth concentration that is greater than the third concentration.

16. The semiconductor device of claim 11, further comprising an insulating structure between the first source/drain region and the second source/drain region, wherein the insulating structure is on a third portion of the side surface of the gate structure.

17. A semiconductor device comprising:

a bit line on a substrate, the bit line extending in a first direction perpendicular to a top surface of the substrate;

a plurality of semiconductor patterns electrically connected to the bit line and extending in a second direction parallel to the top surface of the substrate;

a plurality of gate patterns extending in a third direction different from the first and second directions, the plurality of gate patterns alternating with the plurality of semiconductor patterns in a stacked structure;

an information storage element electrically connected to the plurality of semiconductor patterns; and a buffer layer between at least a portion of the substrate and the plurality of semiconductor patterns and comprising germanium, wherein the substrate includes a fin pattern between the buffer layer and the plurality of semiconductor patterns in the first direction, wherein the substrate and the fin pattern are integrated to each other, wherein the fin pattern is a monolithic structure, wherein the buffer layer is different from the substrate, and wherein the buffer layer is not in contact with the plurality of semiconductor patterns.

18. The semiconductor device of claim 17, wherein a germanium concentration of the buffer layer increases as it gets closer to one or more of the plurality of semiconductor patterns.

19. The semiconductor device of claim 17, wherein the buffer layer comprises first and second buffer layers, the first and second buffer layers comprising germanium at first and second concentrations, respectively, and a third buffer layer between the first and second buffer layers, wherein the second concentration of the second buffer layer is greater than the first concentration of the first buffer layer, and wherein the third buffer layer comprises germanium at a third concentration that is greater than the first concentration of the first buffer layer and less than the second concentration of the second buffer layer.

20. The semiconductor device of claim 17, wherein a thickness of the buffer layer is greater than a thickness of each of the plurality of semiconductor patterns.

* * * * *